(12) United States Patent
Kida et al.

(10) Patent No.: US 6,900,880 B2
(45) Date of Patent: May 31, 2005

(54) EXPOSURE APPARATUS, SURFACE POSITION ADJUSTMENT UNIT, MASK, AND DEVICE MANUFACTURING METHOD

(75) Inventors: Yoshiki Kida, Kawasaki (JP); Tsuneo Miyai, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/648,312

(22) Filed: Aug. 27, 2003

(65) Prior Publication Data

US 2004/0036849 A1 Feb. 26, 2004

Related U.S. Application Data

(63) Continuation of application No. 09/899,171, filed on Jul. 6, 2001.

(30) Foreign Application Priority Data

| Jul. 7, 2000 | (JP) | 2000-207055 |
| Aug. 3, 2000 | (JP) | 2000-235319 |

(51) Int. Cl.⁷ .......................... G03B 27/54; G03B 27/72
(52) U.S. Cl. .................................. 355/67; 355/71
(58) Field of Search .................................. 355/67, 71

(56) References Cited

U.S. PATENT DOCUMENTS

| 5,412,214 A | | 5/1995 | Suzuki et al. |
| 5,506,684 A | * | 4/1996 | Ota et al. .................... 356/401 |
| 5,569,930 A | * | 10/1996 | Imai ........................ 250/559.4 |
| 5,854,671 A | | 12/1998 | Nishi |
| 5,948,572 A | | 9/1999 | Liu et al. |
| 5,989,761 A | | 11/1999 | Kawakubo et al. |
| 6,002,467 A | * | 12/1999 | Nishi et al. .................... 355/61 |
| 6,027,839 A | | 2/2000 | Hashimoto |
| 6,067,146 A | | 5/2000 | Mulkens et al. |
| 6,166,387 A | * | 12/2000 | Muraki et al. ........... 250/492.2 |
| 6,238,851 B1 | * | 5/2001 | Nishi ........................ 430/394 |
| 6,406,820 B1 | | 6/2002 | Ota |
| 2003/0169411 A1 | | 9/2003 | Ota |

FOREIGN PATENT DOCUMENTS

| EP | 0 502 583 | 9/1992 |
| EP | 0 744 665 | 11/1996 |
| EP | 0 753 796 A1 | 1/1997 |
| EP | 0 785 471 | 7/1997 |
| EP | 1 039 511 A1 | 9/2000 |
| EP | 1 061 561 | 12/2000 |
| WO | WO 99/45581 | 9/1999 |

* cited by examiner

Primary Examiner—Rodney Fuller
(74) Attorney, Agent, or Firm—Oblon, Spivak, McClelland, Maier & Neustadt, P.C.

(57) ABSTRACT

The exposure apparatus comprises a projection optical system that has an image field capable of exposing a shot area in a scanning exposure apparatus in one shot. This allows a 1 in 1 exposure, with the shot area being the maximum exposable range of the scanning exposure apparatus. In addition, the main control unit changes the control factor of the exposure system contributing to the throughput, in accordance with the minimum line width of the pattern. The control factor is changed so that the state (or the value) moves into a state where more priority is put on throughput, only when reduction in exposure accuracy is allowed. This makes it possible to improve the throughput while maintaining the exposure accuracy, compared with the case when the exposure system is controlled based on the same value at all times.

29 Claims, 14 Drawing Sheets

| MINIMUM LINE WIDTH SUBJECT TO EXPOSURE l | 0.3μm ≦ l < 0.7μm | 0.7μm ≦ l |
|---|---|---|
| X, Y PERMISSIBLE VALUES | ±0.1μm | ±1μm |
| Z PERMISSIBLE VALUE | ±0.1μm | ±1μm |
| NUMBER OF SCREENS FOR ALIGNMENT MEASUREMENT | 5 | 1 |
| NUMBER OF SAMPLE SHOTS | 12 | 3 |

EXPOSURE APPARATUS, SURFACE POSITION ADJUSTMENT UNIT, MASK, AND DEVICE MANUFACTURING METHOD

BACKGROUND OF THE INVENTION

1. Field of the Invention

The present invention relates to an exposure apparatus, a surface position adjustment unit, a mask, and a device manufacturing method. More particularly, the present invention relates to an exposure apparatus used in a lithographic process to manufacture an electronic device such as a semiconductor device or a liquid crystal display device, a surface position adjustment unit suitable for adjusting the surface position of a substrate in said exposure apparatus, a mask that can be suitably used in said exposure apparatus, and a device manufacturing method using the exposure apparatus.

2. Description of the Related Art

Conventionally, in a lithographic process to manufacture a device such as a semiconductor device or a liquid crystal display device, the static type projection exposure apparatus based on the step-and-repeat method (the so-called stepper), the scanning type projection exposure apparatus based on the step-and-scan method (scanning step type projection exposure apparatus: the so-called scanning stepper), and the like have been mainly used as the projection exposure apparatus.

The semiconductor device is formed by overlaying several tens of circuit patterns onto a substrate such as a wafer; however, the line width of each pattern in each layer is not the same. That is, layers exist, such as: a critical layer which is mostly made up of a circuit pattern having a fine line width the same level as the limit of resolution of the latest edge projection exposure apparatus such as the scanning stepper using the KrF excimer laser as a light source (hereinafter summing it to "KrF scanner unit" as appropriate), a non-critical layer (also referred to as a rough layer) made up of a circuit pattern having a wider line width compared to the critical layer, and a middle layer made up of a circuit pattern which line width is in between the critical layer and non-critical layer.

In general, resolution becomes higher when the exposure wavelength is shorter, and when the exposure wavelength is the same, resolution, in other words, the minimum line width resolvable becomes finer when the numerical aperture (N.A.) of the projection optical system increases. In addition, the resolution of the static type exposure apparatus (also referred to as a one shot exposure apparatus) such as the stepper is far inferior compared with the scanning stepper, whereas, the throughput tends to be high. Accordingly, in the actual manufacturing site of a semiconductor device and the like, various types of exposure apparatus are used depending on the layer, and the same electronic device is usually manufactured using a plurality of types of exposure apparatus. As a method of using a plurality of types of exposure apparatus depending on layers, a mix-and-match; combining a scanning stepper having a short exposure wavelength (for example, a KrF scanner unit) and a stepper having a long exposure wavelength (for example, an i-line stepper), is frequently used.

In addition, with the projection exposure apparatus, it is necessary to transfer the pattern of the mask onto the substrate in a state where the surface of the substrate such as the wafer coincides with the best image-forming plane of the projection optical system. For this reason, in the projection exposure apparatus, a system to detect the position of the wafer surface in the optical axis direction of the projection optical system (hereinafter appropriately referred to as "height position")—a height position detection system—is provided. In recent years, since the height position cannot be detected accurately when the height position measurement of the wafer is performed at only one point due to the influence of steps on the wafer surface, a height position detection system that detects the height position at a plurality of points on the wafer (hereinafter also referred to as a "multiple point AF system") has been proposed. This multiple point AF system, for example, irradiates light having passed through a plurality of slits arranged in a predetermined pitch onto the wafer from an oblique direction, and based on the positional relationship between the light reflected off the wafer and a plurality of photo-detectors (photodetection elements) corresponding to the respective slit lights, the height position is detected with high precision at a plurality of points on the wafer.

In addition, with the height position detection system, detection of the height position becomes difficult when the height position of the wafer deviates from the best focal position and the light reflected off the wafer does not reach the photodetection area of the photodetection elements (when the height position of the wafer is off the range of the height position range detectable by the photodetection element). Also, with the multiple point AF system that irradiates a plurality of slit lights onto the wafer from an oblique direction, forms a plurality of slit images arranged in a predetermined pitch on a wafer, and individually detects the catoptric light of each slit light with a plurality of photo-detectors, if the height position of the wafer deviates from the target position, then the slit images on the wafer deviates in the arrangement direction of the slit images. When the deviation amount of the slit image on the wafer reaches half (½) the pitch of the slit image (the interval between two adjacent slit images), these catoptric lights shift one by one with respect to their corresponding photo-detectors and are incident on the photo-detectors arranged next to the corresponding photo-detectors. Accordingly, the photo-detectors excluding the ones arranged on the edge output the same signals as when the wafer surface is located at the target position. In this case, the multiple point AF system may make an error in detection and consider that the position of wafer surface is at the target position, in spite of the fact that the wafer surface is off the target position.

So, with the current projection exposure apparatus, a photoelectric sensor called a tracking sensor is arranged in general. The tracking sensor detects the deviation direction of the substrate surface from the target position, even in the case the height position cannot be detected because the height position of the substrate surface has deviated from the target position, and when the plurality of light rays for height position detection reflected off the substrate shift one by one with respect to their corresponding photo-detectors and are incident on the photo-detectors arranged next to the corresponding photo-detectors, the tracking sensor detects that the height position of the substrate is off the target position. The multiple point AF system that includes the tracking sensor is disclosed in, for example, Japanese Patent Laid Open (Unexamined) No. 07-130635, and the corresponding U.S. Pat. No. 5,569,930.

In addition, in the case of the projection exposure apparatus such as the conventional steppers, conditions contributing to improvement in throughput that has nothing to do with the improvement of resolution, such as, the stepping velocity of the substrate stage in between shots, permissible positional error on position setting settlement, and the like were always the same when exposure was performed. That is, in what is called the process program file, which is a type of database for setting exposure conditions, various control parameters were set without any options. In other words, with the conventional projection exposure apparatus the control parameters such as the stage parameter were set with the exposable minimum line width as the target; regardless of the pattern line width required.

Now, the size of the exposable maximum area (hereinafter referred to as "exposure range") with a conventional stepper is, for example, a 22 mm×22 mm sized square, whereas with the scanning stepper the size of the exposure range is, for example, a 25 mm×33 mm sized rectangle, being different in size and shape. Therefore, when a shot area of the stepper and a shot area of the scanning stepper were overlaid based on the mix-and-match referred to earlier, and a so-called 1 in 1 exposure was performed, the actual exposure area of the scanning stepper capable of exposing a large area had to be limited to the exposure range of the stepper. Thus, the capability of the scanning stepper (large exposable range) could not be efficiently used.

On the other hand, when one shot area of the scanning stepper and two adjacent shot areas of the stepper are overlaid, and a so-called 2 in 1 exposure is performed, errors of shot rotation, shot magnification, and the like may remain since the center of the two shot areas differ.

In addition, with the conventional stepper and the scanning stepper, in accordance with the different alignment method of the masks, masks that have alignment marks with a different arrangement and number were respectively used. The mix-and-match using both the stepper and the scanning stepper that have a different exposure range size is disclosed in, for example, U.S. Pat. No. 5,989,761.

Also, with the conventional projection exposure apparatus, the measurement point corresponding to the tracking sensor was located at one or two points around the center portion within the projection area. Or, a pair of points was arranged outside a set of opposing sides of a rectangular area serving as the projection area, in the vicinity of the center portion of the remaining opposite sides. Therefore, depending on how the shot area where exposure is performed first (first shot) is set, the situation may occur when the measurement point of the tracking sensor is off the wafer upon first exposure. That is, usually for the first shot, a circumferential shot on the wafer is selected, however, in the case the circumferential shot is a so-called chipped shot, none of the measurement points of the tracking sensor will not be located on the wafer. The tracking sensor is used mainly for setting the wafer surface swiftly in the vicinity of the best focal position upon exposure of the first shot. Accordingly, in order to effectively exhibit the function of the tracking sensor, the first shot needed to be set so that the situation stated above did not occur. Thus, the arrangement of the shot area and the decision (selection) of the first shot were limited.

In addition, as is described above, with the conventional projection exposure apparatus, the parameter of the apparatus was always fixed regardless of the minimum line width subject to exposure, so exposure was performed with the same accuracy in both cases when a pattern with a fine line width was transferred and when a pattern with a wide line width was transferred. That is, even when a rough layer—subject to a pattern having a wide line width—was exposed, the same control parameters such as the permissible value of stage vibration on exposure, the positional deviation permissible value of the substrate surface with respect to the target surface on automatic focusing, and the like were set as when a middle layer or a critical layer—subject to a pattern having an arrower line width (the resolvable minimum line width set in accordance with the exposure wavelength and the numerical aperture of the projection optical system)—was exposed.

As a consequence, even in the case when the required exposure accuracy was low and more priority could have been put on throughput, exposure was performed using the same control values as of the case when the required exposure accuracy was high and priority was required on resolution.

SUMMARY OF THE INVENTION

The present invention has been made in consideration of the circumstances described above, and has as its first object to provide a static type exposure apparatus that can fully expose the capability of a scanning exposure apparatus, and can effectively suppress an overlay error with the pattern formed by the scanning exposure apparatus from occurring.

The second object of the present invention is to provide a mask capable of usage in both the scanning exposure apparatus and the static type exposure apparatus.

And, the third object of the present invention is to provide a surface position adjustment unit capable of swiftly adjusting the positional deviation related to a second object, on which a pattern of a first object is projected, in the optical axis direction of the projection optical system.

In addition, the fourth object of the present invention is to provide an exposure apparatus with an improved degree of freedom when the arrangement of divided areas on the substrate is set and when the exposure sequence of the divided areas is set (selected).

Further, the fifth object of the present invention is to provide a device manufacturing method that can contribute to improving the productivity of a device.

According to the first aspect of the present invention, there is provided a first exposure apparatus that exposes a substrate via a mask with an energy beam in a state where the mask and the substrate are stationary, the exposure apparatus comprising an exposure system which includes: a projection optical system having an image field large enough so that a divided area on the substrate exposed in one time with a scanning exposure apparatus can be exposed in one shot by projecting the energy beam outgoing from the mask onto the substrate; and a substrate stage on which the substrate is mounted.

The scanning exposure apparatus, here, refers to an exposure apparatus based on the scanning type method, such as a scanning stepper (scanning step type projection exposure apparatus), which transfers a pattern of the mask on to a divided area on the substrate while the mask and the substrate are synchronously moved.

With this exposure apparatus, the exposure system comprises a projection optical system that has an image field large enough so that a divided area (shot area) on the substrate exposed in one time with a scanning exposure apparatus can be exposed in one shot by projecting the energy beam outgoing from the mask onto the substrate in a state where the mask and the substrate are stationary. Therefore, on performing the mix-and-match referred to earlier, the shot area that is exposed at once with a scanning exposure apparatus can be exposed in one shot. Accordingly, by the 1 in 1 exposure, the maximum exposable range of the scanning exposure apparatus can be set as the shot area, and this allows the capability of the scanning exposure apparatus to be exhibited to the full, and also becomes possible to suppress residual errors such as shot rotation, shot magnification due to overlay to the utmost, since both the exposure apparatus (the scanning exposure apparatus and the exposure apparatus in the present invention) have the same shot center.

In this case, the one divided area exposed with the scanning exposure apparatus can have a rectangular shape with a size which is one of (25 mm×33 mm) and (26 mm×33 mm). And in this case, the mask can be a 6-inch size, and the projection optical system can have a projection magnification of ¼.

With the first exposure apparatus related to the present invention, the one divided area exposed with the scanning exposure apparatus can have a rectangular shape with a size of (22 mm×26 mm). In this case, the mask can be a 6-inch size, and the projection optical system can have a projection magnification of ⅕.

With the first exposure apparatus related to the present invention, the image field can have a circular shape with a diameter in which the divided area of the scanning exposure apparatus is almost inscribed. That is, in the case the one divided area is of a rectangular shape having the size (ammxbmm), the image field can be of a circular shape having a diameter of at least $D \approx (a^2+b^2)^{1/2}$.

With the first exposure apparatus related to the present invention, the projection optical system can be capable of resolving a pattern having a line width of 0.35 $\mu$m on the substrate.

With the first exposure apparatus related to the present invention, the exposure apparatus can further comprise: a control system which totally controls the exposure system and changes a control factor of the exposure system related to throughput in accordance with a minimum line width of a pattern subject to transfer. In such a case, the exposure system comprises a control system, which changes the control factor of the exposure system related to throughput (hereinafter referred to as "throughput control factor" as appropriate) in accordance with the minimum line width of the pattern subject to transfer. So, for example, on exposure when the minimum line width of the pattern subject to transfer is fine and requires tight exposure accuracy, the throughput factor is changed so that the state (or value) moves into a state where priority on resolution is higher than throughput. Whereas, on exposure when the minimum line width of the pattern subject to transfer is wide and requires moderate exposure accuracy, the throughput factor is changed so that the state (or value) moves into a state where priority on throughput is higher than resolution. Accordingly, it obviously becomes possible to improve the throughput compared with the case when the exposure system is controlled with the same throughput factor at all times. In addition, in this case, since the throughput control factor is changed so that the state (or value) becomes a state where more priority is put on throughput only in the case when the exposure accuracy required is not so high, in other words, in the case when a decrease in exposure accuracy is allowed to some extent, as a consequence, the exposure accuracy can be maintained at a sufficient level.

Accordingly, when mix-and-match with the scanning exposure apparatus such as a scanning stepper is performed, the capability of the scanning exposure apparatus can be fully exhibited, while the exposure accuracy (including the overlay accuracy) can be maintained at a sufficient level. The throughput, in this case, can also be improved.

In this case, the control factor subject to the change can include at least one of: a permissible value of a physical quantity related to a position setting accuracy of the substrate stage; time until position setting of the substrate stage is judged complete; a permissible value of error from a target surface of a surface of the substrate with respect to an optical axis direction of the projection optical system; a permissible value of heat quantity stored in the projection optical system due to irradiation of the energy beam; a permissible value of vibration quantity of the substrate stage during exposure; a permissible error of an exposure amount provided on the substrate; a physical quantity related to an alignment measurement accuracy of the substrate; and an on/off of automatic focusing on alignment measurement.

In this case, the permissible value of the physical quantity related to a position setting accuracy of the substrate stage can include at least one of a permissible error from a position setting target value, a maximum permissible velocity, and a maximum permissible acceleration. In addition, the physical quantity related to an alignment measurement accuracy of the substrate can include at least one of a quantity related to selection on selecting alignment marks for alignment measurement from a plurality of alignment marks on the substrate and a measurement time of the alignment mark.

With the first exposure apparatus related to the present invention, the control system may change the control factor in 2 stages, in the case when the minimum line width is less than 0.7 $\mu$m and in the case when the minimum line width is equal to and over 0.7 $\mu$m.

According to the second aspect of the present invention, there is provided a surface position adjustment unit that makes a surface of a second object almost coincide with an image plane of a projection optical system which projects a pattern formed on a first object, the unit comprising: an irradiation system which forms a plurality of first irradiation points within a projection area of the pattern with the projection optical system by irradiating first lights from an oblique direction with respect to the second object, and also forms a second irradiation point in a vicinity of at least one corner of the projection area by irradiating a second light from an oblique direction on the second object; a first photodetection sensor capable of individually detecting a reflection light from each of the first irradiation points photo-electrically, and of outputting a deviation signal corresponding to a deviation amount of the surface of the second object with respect to a predetermined reference surface related to an optical direction of the projection optical system at each of the first irradiation points; a second photodetection sensor capable of photo-electrically detecting a reflection light of the second light from the second object; a stage which holds the second object and can be driven in at least the optical direction; and a driving unit which drives the stage in the optical axis direction based on an output of the second photodetection sensor to arrange the surface of the second object in a vicinity of a best image forming plane of the projection optical system, and drives the stage in the optical axis direction based on the output of the first photodetection sensor at each of the points to make the surface of the second object almost coincide with the best image forming plane of the projection optical system.

With this unit, the first photodetection sensor detects the deviation amount of the surface of the second object against a predetermined reference surface (for example a target surface) in the optical axis direction of the projection optical system. When the position of the second object in the optical axis direction deviates, however, the reflection lights of the first light, which is the light irradiated from the irradiation system onto a plurality of first irradiation points on the second object, respectively irradiate the position shifted from the corresponding first photodetection sensors, and the situation may occur when the position of the second object in the optical axis direction cannot be detected. Therefore, the driving unit moves the stage based on the output of the second photodetection sensor so as to arrange the surface of the second object held on the stage in the vicinity of the best image forming plane of the projection optical system. And, when the position of the surface of the second object in the optical axis direction is arranged in the vicinity of the best image forming plane of the projection optical system, and the reflection lights of the first light irradiated onto the plurality of first irradiation points are photo-detected by the corresponding first photodetection sensors, the driving unit moves the stage in the optical axis direction so as to make the surface of the second object almost coincide with the best image forming plane of the projection optical system, based on the deviation signals from the respective first photodetection sensors. In this case, the second photodetection sensor can acknowledge that the surface of the second object is located in the vicinity of the image plane of the projection optical system, and this allows the surface of the second object to smoothly coincide with the best image forming plane of the projection optical system. In addition, since the irradiation system irradiates the second light on the second object from an oblique direction and the second irradiation point is formed in the vicinity of at least one corner of the projection area, it is easy to form the second irradiation point on the second object by adjusting the positional relationship of the second object and the projection optical system within the plane perpendicular to the optical axis. Accordingly, even if the shape of the shot area (divided area) on the second object where the pattern of the first object is projected by the projection optical system is partially chipped, the positional deviation of the second object in the optical axis direction of the projection optical system can be swiftly adjusted.

With the surface position adjustment unit according to the present invention, it is preferable for at least one of the second irradiation point to be arranged respectively in a vicinity of four corners of the projection area, and the second photodetection sensor to be individually arranged corresponding to each of the second irradiation points. In such a case, at least a single second irradiation point is formed on the second object without adjusting the positional relationship of the second object and the projection optical system within the plane perpendicular to the optical axis as is described above. Accordingly, even if the shape of the shot area (divided area) on the second object where the pattern of the first object is projected by the projection optical system is partially chipped, the positional deviation of the second object in the optical axis direction of the projection optical system can be swiftly and can also more easily be adjusted.

In this case, selection of a second photodetection sensor to be used can be made from at least four second photodetection sensors corresponding to the second irradiation points. In such a case, even if the shape of the shot area (divided area) on the second object where the pattern of the first object is projected by the projection optical system is partially chipped, it becomes possible to select a suitable second photodetection sensor in accordance with the shape of the shot area.

With the surface position adjustment unit according to the present invention, when at least one of the second irradiation point is arranged respectively in the vicinity of the four corners of the projection area, each of the second irradiation points can be arranged within an area located on an outer side of two triangular shaped areas, when the projection area is divided into four rectangular areas along a two dimensional direction perpendicular to the optical axis and each of the rectangular areas is diagonally divided into two in the two triangular shaped areas.

With the surface position adjustment unit according to the present invention, the second photodetection sensor can function as a tracking sensor and the output of the second photodetection sensor can include whether there actually is a detection signal to be detected.

With the surface position adjustment unit according to the present invention, a selection of a first photodetection sensor to be used can be made arbitrarily from said plurality of first photodetection sensors.

With the surface position adjustment unit according to the present invention, the driving unit may use both outputs of the first photodetection sensor and the second photodetection sensor when the surface of the second object is in the vicinity of the best image forming plane of the projection optical system. That is, when the surface of the second object is in the vicinity of the best image forming plane of the projection optical system, the second photodetection sensor may output signals corresponding to the deviation amount of the surface of the second object with respect to the optical axis direction against the predetermined reference surface, and the driving unit may use both this output and the output of the first photodetection sensor in order to adjust the surface position of the second object in the optical axis direction.

According to the third aspect of the present invention, there is provided a second exposure apparatus that transfers a pattern of a mask onto a substrate via a projection optical system wherein, the first object is the mask, the second object is the substrate, the exposure apparatus including the surface position adjustment unit related to the present invention so as to make the surface of the substrate coincide with the best image forming plane of the projection optical system, and having an exposure system that transfers the pattern.

With this apparatus, even if the shot area (projection area, that is, the divided area) on the substrate where the mask pattern is projected has a shape partially chipped, the positional deviation of the substrate in the optical axis direction of the projection optical system can be swiftly adjusted. Accordingly, there are no serious problems even when the so-called chipped divided area is provided on the substrate. Therefore, the area utility efficiency of the substrate can be improved, as well as increase the degree of freedom when arranging the shot area on the substrate.

In this case, it is preferable for at least one second irradiation point to be formed respectively in a vicinity of four corners of a projection area of the projection optical system, and the second photodetection sensors to be arranged individually corresponding to each of the second irradiation points. In such a case, a divided area (including a chipped divided area) of any position on the substrate can be set (selected) as the divided area where exposure is to be first performed without any problems, therefore, the degree of freedom can also be improved when setting (selecting) the exposure sequence of the divided areas.

With the second exposure apparatus according to the present invention, the second irradiation point can be formed in the vicinity of a plurality of corners of the projection area, and the driving unit can select the second irradiation point formed in the vicinity of at least one corner of the plurality of corners in accordance with a position of a divided area on the substrate corresponding to the projection area, and can drive the stage based on a photoelectric detection result by the second photosensor of a reflection light from a surface of the second object at the second irradiation point. In such a case, when the divided area corresponding to the projection area where the mask pattern is projected by the projection optical system is a chipped shot, the driving unit selects the suitable second irradiation point in accordance with the shape of the divided area so that it can drive the stage and control the position in the optical axis direction, based on the photoelectric detection results of the reflection light from the surface of the second object at the selected irradiation point by the second sensor. In addition, it is possible to select the second photodetection sensor to be used depending on the size of the divided area (shot area).

With the second exposure apparatus according to the present invention, the projection optical system may have an image field large enough so that a divided area on the substrate can be exposed in one shot in a state where the mask and the substrate are stationary, the divided area being an area exposed in one time with a scanning exposure apparatus used to perform scanning exposure on the substrate at one of a timing before and after an exposure process of the substrate using the mask. In such a case, by 1 in 1 exposure, the maximum exposable area of the scanning exposure apparatus can be set as the shot area, and this allows the capability of the scanning exposure apparatus to be exhibited to the full, and also becomes possible to suppress residual errors such as shot rotation, shot magnification due to overlay to the utmost, since both the exposure apparatus have the same shot center.

In this case, the exposure apparatus can further comprise: a control system which totally controls the exposure system and changes a control factor of the exposure system related to throughput in accordance with a minimum line width of a pattern subject to transfer.

With the second exposure apparatus according to the present invention, regardless of the size of the image field of the projection optical system, the exposure apparatus may further comprise: a control system which totally controls the exposure system and changes a control factor of the exposure system related to throughput in accordance with a minimum line width of a pattern subject to transfer. In such a case, for example, on exposure when the minimum line width of the pattern subject to transfer is fine and requires tight exposure accuracy (such as in the exposure of a critical layer), the throughput factor is changed so that the state (or value) moves into a state where priority on resolution is higher than throughput, whereas, on exposure when the minimum line width of the pattern subject to transfer is wide and requires moderate exposure accuracy (such as in the exposure of a non-critical layer (rough layer or a middle layer)), on the contrary, the throughput factor is changed so that the state (or value) moves into a state where priority on throughput is higher than resolution. Accordingly, it obviously becomes possible to improve the throughput compared with the case when the exposure system is controlled with the same throughput factor at all times.

In the mix-and-match exposure using the scanning exposure apparatus and the static type exposure apparatus, when the divided area on the substrate exposed by the scanning exposure apparatus is made so that it can be exposed in one shot with the static type exposure apparatus as is described above, it becomes possible for the static type exposure apparatus to use the mask that has the same pattern area as the mask conventionally used by the scanning exposure apparatus. Taking this a step further, the possibility of the scanning exposure apparatus and the static type exposure apparatus using the very same mask arises. The arrangement of the mask alignment mark differs between the mask for the scanning exposure apparatus and the static type exposure apparatus. The mask related to the present invention has been made under such circumstances.

According to the fourth aspect of the present invention there is provided a mask used in an exposure apparatus, the mask comprising: a mask substrate; and a predetermined pattern which is formed on one side of the mask substrate and includes a circuit pattern and a mask alignment mark for a scanning exposure apparatus and a mask alignment mark for a static type exposure apparatus.

The mask according to the present invention, contains alignment marks for the respective apparatus, therefore, in cases such as when mix-and-match is performed, it is possible to use the mask in both the scanning exposure apparatus and the static type exposure apparatus.

In this case, the predetermined pattern may further include a pattern for aerial image measurement.

In addition, in a lithographic process, by using either the first exposure apparatus or the second exposure apparatus of the present invention, a pattern can be accurately formed on a substrate, thus allowing production of a microdevice with a higher integration with good yield. Accordingly, from another aspect of the present invention, there is provided a device manufacturing method that uses either the first exposure apparatus or the second exposure apparatus of the present invention.

DESCRIPTION OF THE PREFERRED EMBODIMENTS

Figure 1:
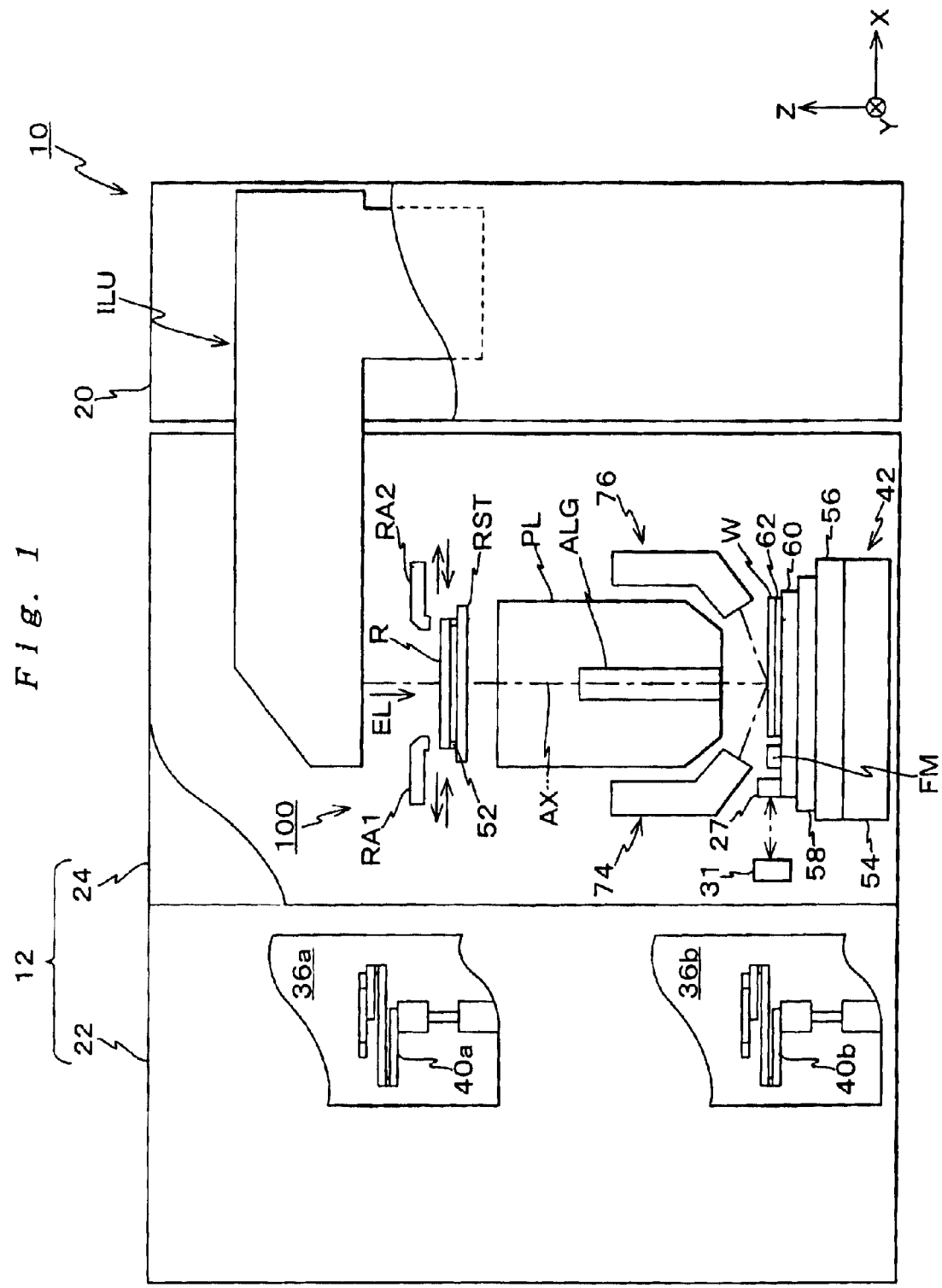
FIG. 1 is a schematic view showing the arrangement of the exposure apparatus of an embodiment according to the present invention.

An embodiment according to the present invention will now be described, with reference to FIGS. 1 to 12. In FIG. 1, an arrangement of an exposure apparatus related to the embodiment is schematically shown. The exposure apparatus 10 is a reduction projection exposure apparatus (the so-called stepper) based on the step-and-repeat method. And, the exposure apparatus 10 comprises a main body chamber 12 and a mechanical room chamber 20 arranged adjacent in the X-axis direction (the horizontal direction in FIG. 1) on the floor surface of the clean room.

The main body chamber 12 is divided into two rooms; room 22 and room 24, with a partition wall. Room 22, located on the left in FIG. 1, houses a main controller 28 (refer to FIG. 5), processors besides the main controller 28, and the like serving as a control system that will be describe later on. In addition, inside this room 22, two rooms 36a and 36b are vertically provided, divided by a partition wall not shown in Figs. The upper room 36a serves as a reticle loader chamber where a reticle loader 40a consisting of a reticle library (not shown in Figs.) and a jointed arm robot, and the like are arranged. Also, the lower room 36b serves as a wafer loader chamber where a wafer loader 40b consisting of a wafer carrier (not shown in Figs.) and a jointed arm robot, and the like are arranged. Furthermore, an input/output unit 29 (refer to FIG. 5) such as a display and a keyboard are arranged outside the room 22.

Room 24 serves as an exposure room where most of the exposure system 100 is housed. The exposure system 100 comprises: an illumination unit ILU which illuminates a reticle R serving as a mask with an emission line in the ultraviolet region (i-line) having a wavelength of 365 nm; a reticle stage RST which holds the reticle R; a projection optical system PL arranged below the reticle stage RST as in FIG. 1; and a stage 24 arranged below the projection optical system PL on which a wafer W serving as a substrate (and a second object) is mounted, and the like. As is shown in FIG. 1, a part of the illumination unit ILU (the right hand side in FIG. 1) is housed in the mechanical room chamber 20, and the remaining portion is housed within the exposure room 24. Other parts structuring the exposure system 100 are arranged within the exposure room 24.

In the mechanical room chamber 20, air conditioning units including a cooler, a heater, an air distribution fan (all of them omitted in Figs.), and the like are housed. With these air conditioning units, the exposure room 24, reticle loader room 36a, and wafer loader room 36b are air conditioned via an air supply/exhaust piping system (not shown in Figs.), and the temperature of these rooms is controlled so as to maintain a target temperature of around ±0.1° C. In addition, in various places of the air supply/exhaust system, air filters (HEPA filter, ULPA filter, and the like) for removing particles are arranged if necessary. Incidentally, chemical filters may be arranged in the air supply/exhaust system at necessary places to remove organic material or ion. Also, in the mechanical room chamber 20, a part of the illumination unit ILU and the air conditioning unit are arranged in two independent rooms divided by a partition wall (not shown in Figs.), and the air conditioning unit performs air conditioning of the room where a part of the illumination unit ILU is arranged.

Figure 2:
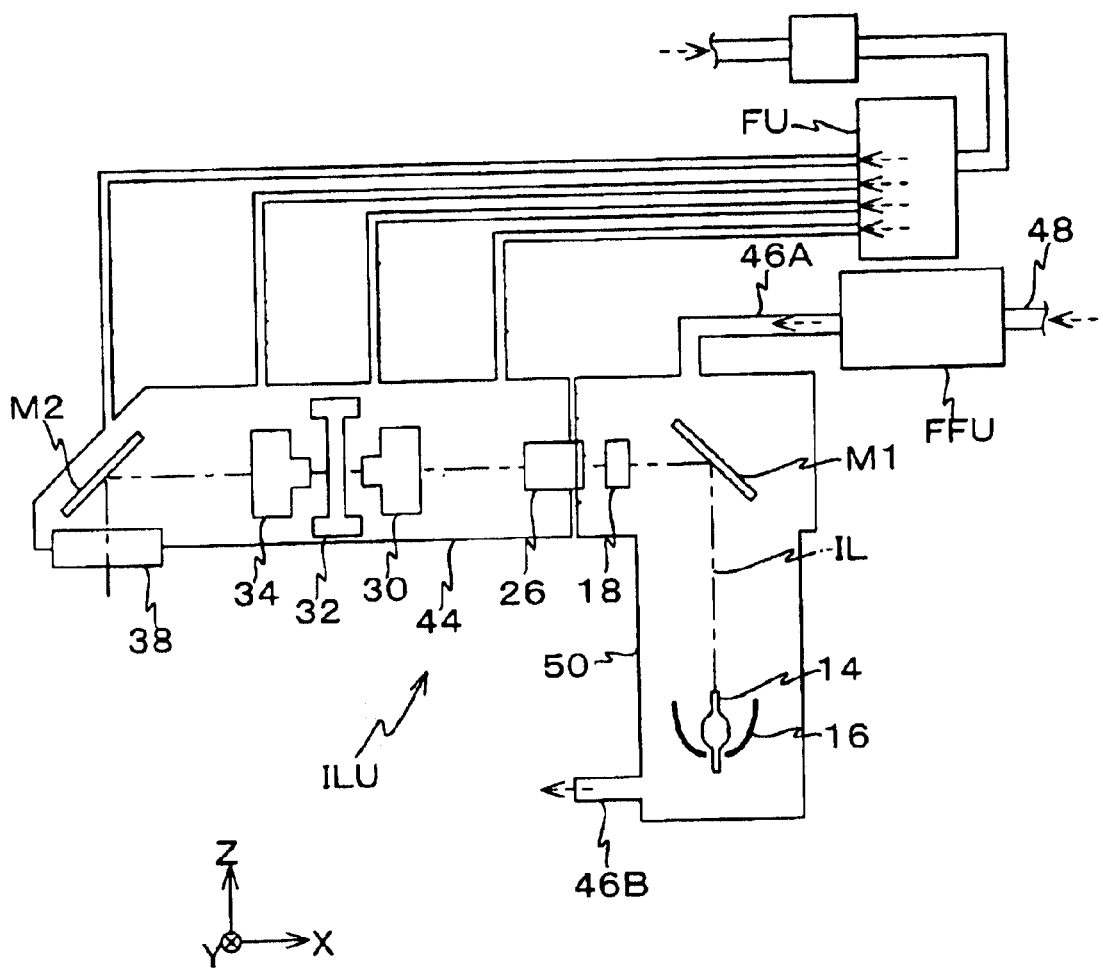
FIG. 2 is a detailed view showing the illumination unit portion in FIG. 1.

Next, a detailed description will be made on each part that structures the exposure system 100. As is shown in FIG. 2, the illumination unit ILU is actually divided into two housing portions. The housing 50 indicated on the right hand side in FIG. 2 is a lamp house that houses an ultra-high pressure mercury lamp serving as a light source for exposure (hereinafter referred to as "mercury lamp"). And, the housing 44 indicated on the left hand side in FIG. 2 is an illumination system housing that houses various types of optical members.

Inside the lamp house 50, a mercury lamp 14, an elliptic mirror 16, a shutter (not shown in Figs.), an interference filter 18, and the like are arranged in a predetermined positional relationship. Also, inside the illumination system housing 44, arranged from the right side, a first relay lens 30, a reticle blind 32, a second relay lens 34, and a mirror M2 are housed. And, at the borderline portion of the lamp house 50 and the illumination system housing 44, an illuminance unifying optical system 26 that includes an input lens or an optical integrator (such as a fly-eye lens, an internal reflection type integrator (such as a rod lens), or a diffraction optical element, and in this embodiment a fly-eye lens is used and hereinafter will also be referred to as "fly-eye lens") or the like, is arranged. In addition, at the outgoing end portion of the illumination system housing 44, that is, below the mirror M2, a main condenser lens 38 is arranged.

The description of each portion making up the illumination unit ILU (excluding the housing) will now be made with details on its operation, based on FIG. 2. The illumination light EL emitted from the mercury lamp 14 is condensed at the second focal point by the elliptic mirror 16. In the vicinity of the second focal point, a shutter (not shown in Figs.) opened/closed by the shutter driving mechanism (not shown in Figs.) is arranged, and when the shutter is open, the illumination light EL is incident on the interference filter 18 via the mirror M1. And, the interference filter 18 extracts only the wavelength spectrum necessary for exposure, such as the i-line with the wavelength of 365 nm. As the exposure light, other than the i-line, the g-line having a wavelength of 436 nm may be used, or a mixture of light having a plurality of types of wavelengths may also be used. Further, instead of the mercury lamp 14, the light source may be structured of an excimer laser or the like that emits a pulse light in the far ultraviolet region, such as the KrF excimer laser beam (wavelength: 248 nm) or the ArF excimer laser beam (wavelength: 193 nm).

The exposure light EL having passed through the interference filter 18 (i-line component) then enters the illuminance unifying optical system 26. The focal plane on the outgoing side of the fly-eye lens structuring the illuminance unifying optical system 26 has a positional relationship conjugate with the mercury lamp 14, and makes up a secondary light source plane.

Figure 5:
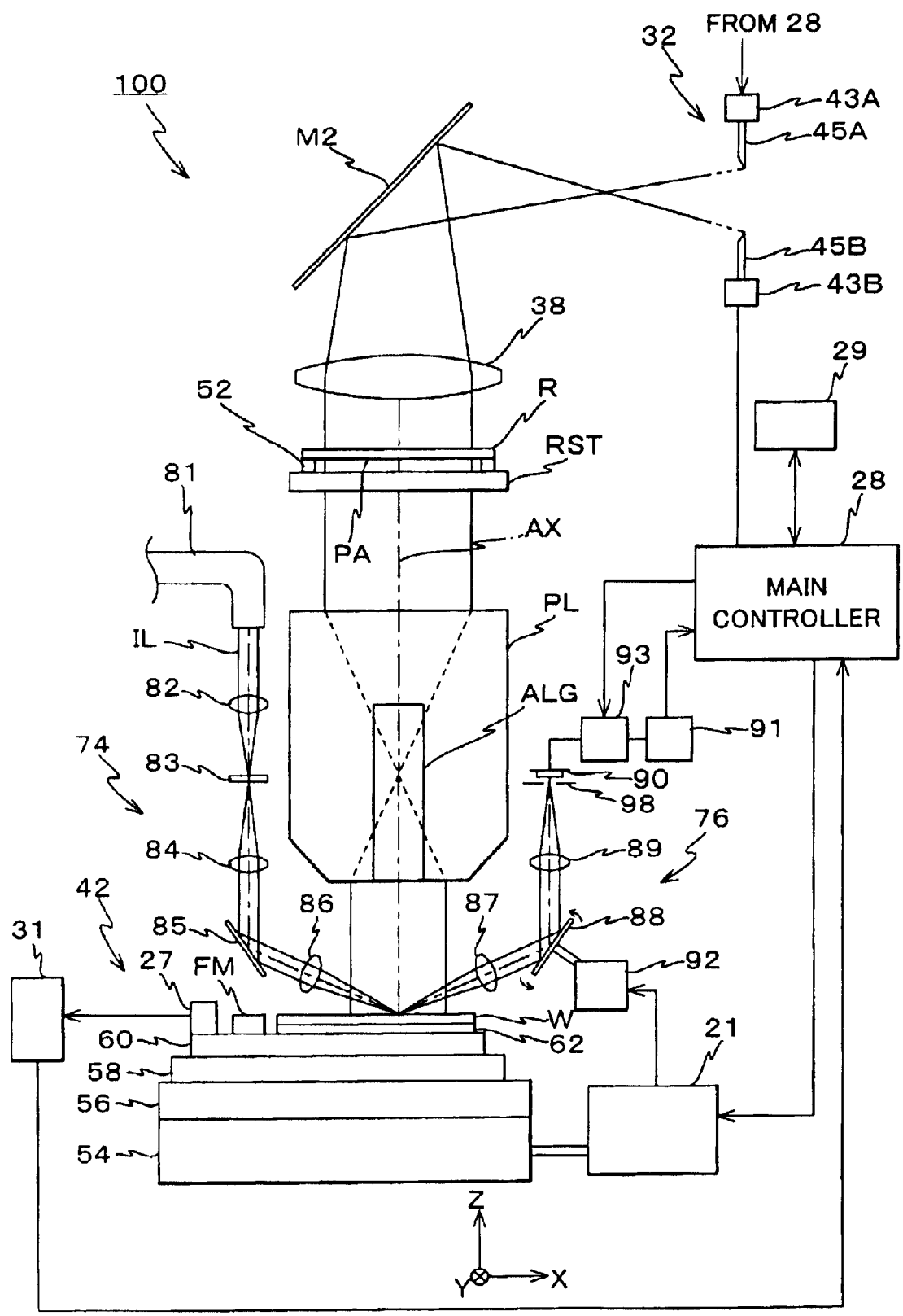
FIG. 5 is a view showing a detailed arrangement of a focal position detection system in FIG. 1 with the stage unit.

The light emitted from each point light source (element) structuring the secondary light source plane of the fly-eye lens passes through the illumination system aperture stop (not shown in Figs.), the first relay lens 30, and then illuminates the reticle blind 32. In this case, as the reticle blind 32, a variable blind which shape of opening is variable is employed. As is shown in FIG. 5, a movable blind is arranged as the reticle blind 32 which is made up of two L-shaped movable blades 45A and 45B (hereinafter, the movable blind will also be referred to as "movable blinds 45A and 45B"). The arrangement surface of the movable blinds 45A and 45B is conjugate with the pattern surface of the reticle R. And the movable blinds 45A and 45B are driven via movable blind driving mechanisms 43A and 43B, which operation is controlled by the main controller 28. In the case of using the internal reflection type integrator as the optical integrator, the secondary light source plane referred to earlier becomes the side of the entering plane, and as an example, the reticle blind (masking blade) 32 is arranged close to the outgoing surface which is substantially conjugate with the reticle pattern.

Referring back to FIG. 2, the illumination light EL (i-line component) having passed through the opening of the reticle blind 32, passes through the second relay lens 34, then is deflected by the mirror M2 and illuminates the reticle R arranged in a positional relationship of Fourier Transform with the secondary light source plane, via the main condenser lens 38. In this case, individual lens elements of the fly-eye lens play the role of an optical integrator by illuminating the reticle R via the main condenser lens 39. Accordingly, the illumination area set by the opening of the reticle blind 32 on the reticle R can be illuminated in uniform.

In this embodiment, the lamp house 50 is connected to the chemical filter fan unit FFU via two hoses 46A and 46B. The chemical filter fan unit FFU is structured of: a chemical filter; an air distribution portion incorporating a fan; and a ULPA filter (all of them omitted in Figs.), arranged from the right side in FIG. 2. In this case, the left hand edge in FIG. 2 of the HEPA filter and the upper edge of the lamp house 50 are connected by the hose 46A, and the air within the lamp house 50 is exhausted from the air exhausting portion 46B arranged at the lower edge. In addition, an air intake 48 is arranged projecting on the right hand edge of the chemical filter.

The chemical filter may have any structure, so long as it can remove clouding materials (chemical material) such as the ammonium sulfate as the mainline, and any type of chemical filters such as the electrostatic type, the activated carbon type, the chemical added activated carbon type, the ion exchange type, can be used.

The operation of the chemical filter fan unit FFU will now be briefly described. When the main controller 28 (refer to FIG. 5) turns on the mercury lamp 14, the fan incorporated in the air distribution portion is driven simultaneously, and the air taken in by the air intake 48 is provided to the lamp house 50 through the chemical filter fan unit FFU and the hose 46A.

The air taken in by the air intake 48 becomes a chemically cleaned air (that is, air which clouding materials are removed) by passing through the chemical filter. Then, when after physical dust (air particles) is removed by the ULPA filter, the air is supplied to the lamp house 50 via the hose 46A.

The cleansed air supplied to the lamp house 50 chemically clean, as well as physically clean, becomes heated air due to the heat generation of the mercury lamp 14 and is exhausted through the exhausting portion 46B.

The air intake 48 takes in the outer air (the air in the clean room atmosphere) by natural intake, and during the air circulation referred to above, pressure at the downstream side of the air distribution portion is positive with respect to the external pressure due to the rotation of the fan (not shown in Figs.), whereas pressure at the upstream side is negative, so the amount of outer air taken in relevant to the portion where the pressure is positive to the external pressure, mainly the amount almost the same as the air flowing out from the lamp house 50.

As is described, in the embodiment, since air which clouding materials are removed by the chemical filter is supplied to the lamp house 50, the optical reflection surface or the transmittance surface of the elliptic mirror 16, the mercury lamp 14, the mirror M1, and the like are not clouded. Therefore, a decline in performance of the exposure apparatus due to the reduction in transmittance of the optical system or the like can be prevented.

Incidentally, the air supplied to the lamp house 50 may be returned to the chemical filter fan unit FFU through a hose or the like. This can extend the life of the chemical filter, which results in reducing the running cost and improving the maintenance ability becomes possible. In this case, a cooler may be arranged within the chemical filter fan unit FFU, so that the air exhausted from the lamp house 50 may be cooled off.

Meanwhile, as is shown in FIG. 2, to the illumination system housing 44, dry air which is a factory utility is supplied at all times via the filter unit FU incorporating the chemical filter and the HEPA filter (or the ULPA filter). In this case, as well, air which clouding materials are removed by the chemical filter is supplied to the illumination system housing 44, therefore the optical reflection surface or the transmittance surface of the lenses, mirrors, and the like are not clouded, thus a decline in performance of the exposure apparatus due to the reduction in transmittance of the optical system or the like can be prevented. In this case, since the illumination system housing 44 is not hermetically sealed, the dry air supplied leaks out into the exposure room by natural exhaustion.

Referring back to FIG. 1, the reticle stage RST has a vacuum suction portion 52 on its upper surface in the four corner portions, and via the vacuum suction portion 52 the reticle R is held on the reticle stage RST. The reticle stage RST has an opening (omitted in Figs.) corresponding to the pattern area PA (refer to FIG. 3), which is an area where the circuit pattern of the reticle R is formed. And, the reticle stage RST is finely movable in the X direction, Y direction, and θz direction (the rotational direction around the Z-axis) by the driving mechanism (not shown in Figs.).

Figure 3:
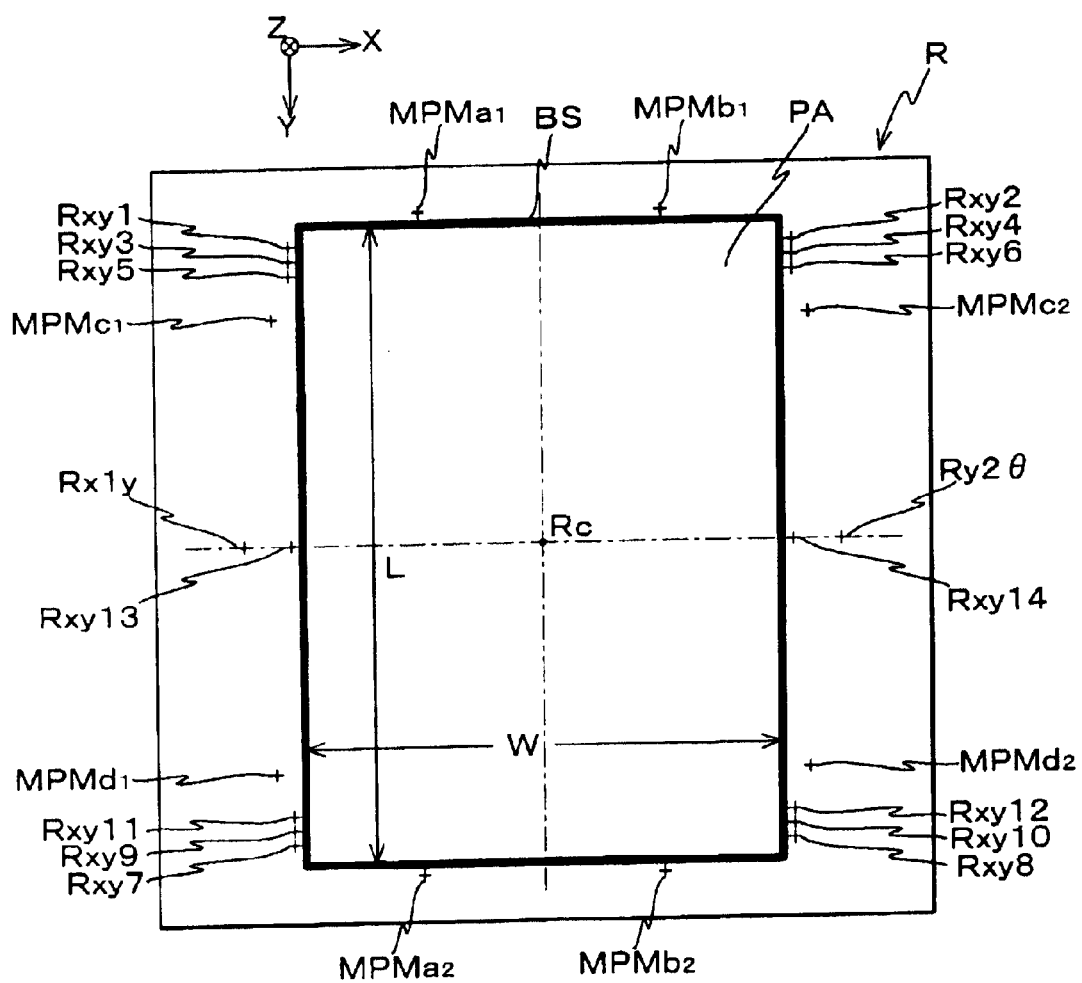
FIG. 3 is a view (a planar view) showing the reticle in FIG. 1 from the pattern surface side (from the lower surface side in FIG. 1)

Next, the reticle R used in the embodiment will be described, based on FIG. 3. FIG. 3 shows a planar view of the reticle R when viewed from the pattern surface side (from the lower surface in FIG. 1). As the reticle R, a square shaped glass substrate is used, that has a side 6 inches, or around 152.4 mm. On one surface of the glass substrate (the upper surface side in FIG. 3), a rectangular pattern area PA having a lateral length W (W, for example, around 100 mm) and a longitudinal length L (L, for example, around 132 mm) is formed. The center of the pattern area PA coincides with the center of the glass substrate designwise. The center of the pattern area PA will hereinafter be referred to as the reticle center Rc. On the periphery of the pattern area PA, a blackout strip BS is arranged, having a width of around 2 mm.

With the projection optical system, the reticle needs to be aligned at a predetermined reference position prior to exposure. As the reference for the alignment, the reticle alignment mark is usually arranged. And, by measuring the reticle alignment mark using the reticle alignment microscope (the reticle alignment microscope used in the embodiment will be referred to later in the description) the deviation from the reference position of the reticle ($\Delta X$, $\Delta Y$, and $\Delta \theta z$) is obtained, and the alignment of the reticle is performed to finely drive the reticle (fine adjustment) and correct these deviations. The reticle alignment is always performed prior to exposure regardless of the first layer, the second layer, or the layer onward; therefore, it is necessary to form the reticle alignment mark on all the reticles in advance.

On the reticle R used in the embodiment, as is shown in FIG. 3, along the X-axis passing through the reticle center Rc at a symmetric position with respect to the reticle center Rc, 15 mm away from the outer edge of the pattern area PA (the inner edge of the blackout strip BS), a pair of reticle alignment marks Rx1y and Rx2$\theta$ are arranged. Besides the pair, on the reticle 3, as is shown in FIG. 3, seven pairs of reticle alignment marks—Rxy1, Rxy2, Rxy3, Rxy4, Rxy5, Rxy6, Rxy7, Rxy8, Rxy9, Rxy10, Rxy11, Rxy12, Rxy13, and Rxy14—are respectively formed in the vicinity of (0.1–0.2 mm away from) the blackout strip BS in an arrangement symmetric to the Y-axis passing through the reticle center Rc.

Of these marks, the pair of reticle alignment marks Rxy13 and Rxy14 is arranged on the X-axis passing through the reticle center Rc. In addition, the reticle alignment marks Rxy1, Rxy3, and Rxy5, and the reticle alignment marks Rxy7, Rxy9, and Rxy11 are respectively symmetric to the X-axis passing through the reticle center Rc, and similarly, the reticle alignment marks Rxy2, Rxy4, and Rxy6, and the reticle alignment marks Rxy8, Rxy10, and Rxy12 are respectively symmetric to the X-axis passing through the reticle center Rc.

As is shown in FIG. 3, on the reticle R, other than the reticle alignment marks described above, four pairs of measurement marks MPMa$_1$, MPMb$_1$, MPMa$_2$, MPMb$_2$, MPMc$_1$, MPMc$_2$, MPMd$_1$, and MPMd$_2$ used for image forming characteristics measurement are formed in an arrangement symmetric to the Y-axis passing through the reticle center Rc, close to the outside of the blackout strip BS. In this case, the measurement marks MPMa$_1$, MPMb$_1$, MPMc$_1$, and MPMc$_2$ are symmetric to the measurement marks MPMa$_2$, MPMb$_2$, MPMd$_1$, and MPMd$_2$ with respect to the X-axis passing through the reticle center Rc.

Referring back to FIG. 1, reticle alignment microscopes RA1 and RA2 that have pick up devices such as the CCD and operate based on the image processing method using light with the exposure wavelength as the illumination light for alignment are arranged in a pair above the reticle R. In this case, the reticle alignment microscopes RA1 and RA2 are provided in a symmetrical (horizontally symmetric) arrangement with respect to the YZ plane including the optical axis AX of the projection optical system. In addition, these reticle alignment microscopes RA1 and RA2 have a structure capable of reciprocally moving along the X-axis direction within the XZ plane passing through the optical axis AX.

Normally, these reticle alignment microscopes RA1 and RA2 are arranged at a position where they can observe each of the pair of reticle alignment marks Rx1y and Rx2$\theta$ arranged outside the blackout strip of the reticle R, in a state where the reticle R is mounted on the reticle stage RST. That is, the reticle alignment marks Rx1y and Rx2$\theta$ are normally used for the reticle alignment of the exposure apparatus 10. In other words, the reticle alignment marks Rx1y and Rx2$\theta$ are mask alignment marks for the static type exposure apparatus such as the exposure apparatus 10.

The reticle alignment microscopes RA1 and RA2, however, are reciprocally movable along the X-axis direction. Therefore, it is, as a matter of course, possible to use the pair of alignment marks Rxy13 and Rxy14 that are arranged closer to the pattern area PA as the reticle alignment marks, instead of using the reticle alignment marks Rx1y and Rx2$\theta$.

In either case, by using the reticle alignment microscopes RA1 and RA2, the reticle R can be aligned so that the center of the pattern area PA (the reticle center Rc) passes through the optical axis AX of the projection optical system PL.

Meanwhile, in the case of using the reticle R in the scanning exposure apparatus such as the scanning stepper, of the seven pairs of reticle alignment marks—Rxy1, Rxy2, Rxy3, Rxy4, Rxy5, Rxy6, Rxy7, Rxy8, Rxy9, Rxy10, Rxy11, Rxy12, Rxy13, and Rxy14—at least one pair is used as the reticle alignment mark. That is, the reticle alignment marks Rxy1 to Rxy14 are mask alignment marks for the scanning exposure apparatus, and the reticle alignment marks Rxy13 and Rxy14 in particular, are marks that can be used both in the static type exposure apparatus and in the scanning type exposure apparatus.

As is obvious from the description so far, with the exposure apparatus 10 in the embodiment, since the reticle alignment microscopes RA1 and RA2 are movable in the X-axis direction, reticle alignment can be performed using at least a pair of a suitable reticle alignment mark, even in the case when a reticle for the scanning exposure apparatus is used.

The projection optical system PL is held by a main body column (not shown in Figs.) under the reticle R, with the direction of the optical axis AX as the Z-axis direction. The projection optical system PL is, for example, a double telecentric refraction optical system consisting of a plurality of lens elements (refraction optical elements) arranged at a predetermined interval in the direction of the optical axis AX and a barrel to hold these lens elements. As the projection optical system PL, a projection optical system is used that has a numerical aperture N.A. of 0.52, a projection magnification of ¼, and an image field Ef on the image plane side a circular shape with the diameter D=around 41.4 mm (refer to FIG. 9), and can resolve a pattern having a line width of around 0.3 $\mu$m on the wafer W. With this projection optical system PL, since the equation $(25 \times 25 + 33 \times 33)^{1/2} = 41.4$ is valid, it is possible to expose a rectangular exposure range of 25 mm×33 mm all at once.

Referring back to FIG. 1, the stage unit 42 has: a base 54; a Y stage 56 reciprocally movable in the Y-axis direction in FIG. 1 on the base 54; an X stage 58 reciprocally movable in the X-axis direction, which is perpendicular to the Y-axis direction, on the Y stage 56; and a substrate table 60 serving as a substrate stage arranged on the X stage 58. In addition, on the substrate table 60, a wafer holder 62 having a shape almost circular, is mounted, and the wafer holder 62 holds the wafer W by vacuum chucking.

Figure 4:
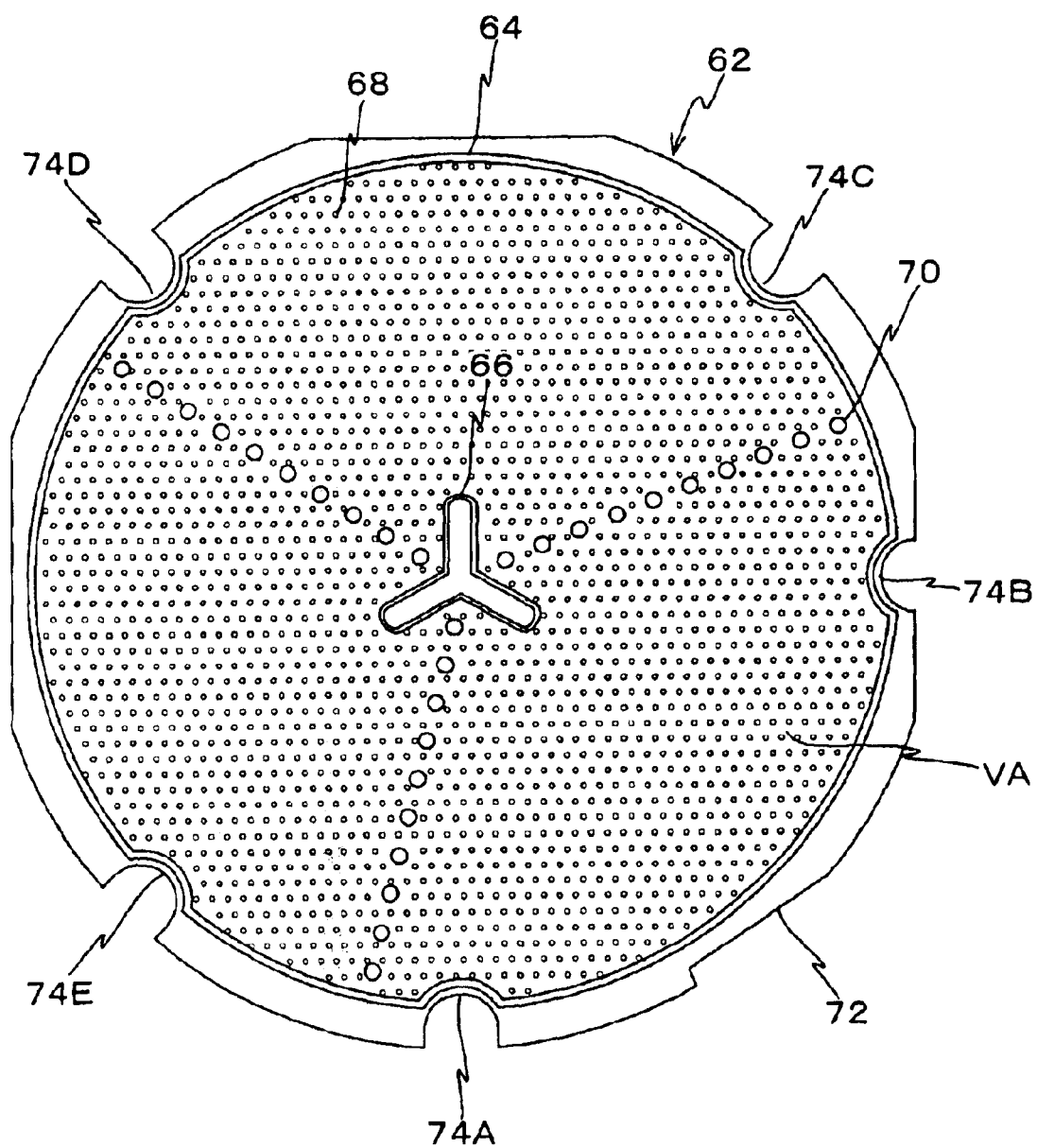
FIG. 4 is a planar view showing the wafer holder in FIG. 1.

FIG. 4 schematically shows a planar view of the wafer holder 62. As is shown in FIG. 4, the wafer holder 62 has an outer wall (rim portion) 64 almost circular, and a trefoilshaped inner wall 66 located at the center portion of the wafer holder 62. The area enclosed by the outer wall 64 and the inner wall 66 having a predetermined shape, is the vacuum area VA, and within this area a large number of pins 68 having a diameter around 0.15 mm and a height around 0.02 mm are arranged on the entire area at a substantially equivalent interval. The height of the inner wall 66 and outer wall 64 is also to be around 0.02 mm. In addition, within the vacuum area VA, a plurality of vacuum openings 70 are arranged in the radius direction with the central angle spaced 120° apart. In a loaded state of the wafer W where the wafer W is mounted on the wafer holder 62, the space in between the pins 68 enclosed by the lower surface of the wafer W, the inner wall 66, and the outer wall 64 is vacuum-chucked with the negative pressure of the vacuum pump (not shown in Figs.) via the plurality of vacuum openings 70, and the wafer holder 62 holds the wafer W by suction.

Further outside the outer wall 64 of the wafer holder 62, as is shown in FIG. 4, a flange portion 72 is formed on almost the entire periphery area. On the flange portion 72, a total of five U-shaped notches 74A–74E are formed here and there. These notches 74A–74B are provided so that wafer edge sensors can be arranged to detect the edge of the wafer W, in order to obtain the center position deviation and the rotational deviation of the wafer W. That is, at the upper side and lower side positions of the flange portion 72 corresponding to the inner side portion of the notches 74A–74E, a light-emitting element and a photodetection element (or a photodetection element and a light-emitting element) that make up a transmittance type photodetection unit are respectively arranged. The sensor arranged at the position corresponding to the inner portion of the notch 74A is used to detect the notch of the wafer W that is mounted with the direction of the notch facing the direction of 0° (the six o'clock direction). The sensor arranged at the position corresponding to the inner portion of the notch 74B is used to detect the notch of the wafer W that is mounted with the direction of the notch facing the direction of 90° (the three o'clock direction). The sensor arranged at the position corresponding to the inner portion of the notch 74C is used to detect a part of the peripheral portion of the wafer W that is mounted with the direction of the notch facing the direction of 0° (the six o'clock direction). The sensor arranged at the position corresponding to the inner portion of the notch 74D is used to detect a part of the peripheral portion, regardless of the direction of the wafer that is mounted (the direction of 0° or the direction of 90°). And, the sensor arranged at the position corresponding to the inner portion of the notch 74E is used to detect a part of the peripheral portion of the wafer W that is mounted with the direction of the notch facing the direction of 90° (the three o'clock direction).

Referring back to FIG. 1, the substrate table 60 is positioned on the X stage 58 in the XY direction, and is attached in a state where movement in the Z-axis direction and tilt with respect to the XY plane are allowed. And, the substrate table 60 is supported with three shafts (not shown in Figs.) at three different supporting points. These three shafts are independently driven in the Z-axis direction by the wafer driving unit 21 (refer to FIG. 5), and due to this operation the surface position of the wafer W (the position in the Z-axis direction and the tilt with respect to the XY plane) held on the substrate table 60 is set at a desired state.

A movable mirror 27 is fixed on the substrate table 60, and the position of the substrate table 60 in the X direction, the Y direction, and the θz direction (rotational direction around the Z-axis) is monitored by an interferometer 31 arranged external to the substrate table 60. The positional information obtained by the interferometer 31 is sent to the main controller 28 (refer to FIG. 5). And, for example, the end surface of the substrate table 60 may be mirror-polished so that it may serve as the reflection surface of the interferometer 31 (corresponding to the reflection surface of the movable mirror 27). The main controller 28 controls the positioning operation of the Y stage 56, X stage 58, and substrate table 60 via the wafer driving unit 21 (this unit includes all of the driving system of the X stage 58 and Y stage 56, and the driving system of the substrate table 60) shown in FIG. 5, and furthermore has the operation of the entire apparatus under control.

In addition, on one edge of the substrate table 60, a fiducial mark plate FM on which various types of fiducial marks are formed is fixed. These various types of fiducial marks include reference marks used for baseline measurement (to be referred later), which measures the distance from the detection center of the alignment system based on the off-axis method to the optical axis of the projection optical system PL, and reticle alignment, and the like. Also, on one edge of the substrate table 60, a reference planar plate (not shown in Figs.) that structure a part of an aerial image measurement unit based on the slit-and-scan method which details are disclosed in, for example, Japanese Patent Laid Open No. 08-83753, and the corresponding U.S. Pat. No. 5,650,840, is fixed. On this reference planar plate, a predetermined slit is formed, and within the substrate table 60 a photodetection optical element is arranged so as to detect the light entering the substrate table 60 via the slit. The disclosures cited above are fully incorporated herein by reference.

On the -Y side of the barrel of the projection optical system PL (the upper surface side of FIG. 1), an alignment system ALG serving as a mark detection system based on the off-axis method is arranged. As this alignment system ALG, for example, an FIA (Field Image Alignment) system alignment sensor which incorporates a focal detection system, and also illuminates a mark with a broadband light such as a halogen lamp and measures the position of the mark by image-processing the mark image, as is disclosed in detail in, for example, Japanese Patent Laid Open No. 07-321030, and the corresponding U.S. Pat. No. 5,721,605, is used. This alignment system ALG is capable of measuring the position of the fiducial marks on the fiducial mark plate FM and the alignment marks on the wafer provided on the substrate table 60 in XY two-dimensional directions. The disclosures cited above are fully incorporated herein by reference.

The information from the alignment system ALG is sent to the alignment control unit (not shown in Figs.). And the alignment control unit performs analog-to-digital (A/D) conversion on the information, and the mark position is detected by arithmetically processing the digitally converted waveform signals. The detected information on the mark position is then sent to the main controller 28.

As the alignment system ALG, it is possible to use, for example, an alignment sensor which employs a detection method, for example, based on detection of a diffracted light or a scattering light, besides the image forming method (image processing method) employed by the FIA system and the like. For example, an alignment system that irradiates a coherent beam almost perpendicularly on an alignment mark on the wafer, and detects a diffracted light of the same order (diffracted light of the $\pm 1^{st}$ order, $\pm 2^{nd}$ order, . . . , $\pm n^{th}$ order) generated from the mark made to interfere, may be used. In this case, the diffracted light may be detected independently by order and the detection result of at least one order may be used, or a plurality of coherent beams having different wavelengths may be irradiated on the alignment mark and the diffracted light of each order made to interfere by wavelength may be detected.

With the exposure system 100, when the reticle alignment and the like referred to earlier are completed, the main controller 28 performs alignment of the reticle R and the wafer W based on the detection signals of the alignment system ALG. And based on the detection signals of the focal detection system (to be referred to later) the main controller 28 drives and controls the substrate table 60 in the Z-axis direction and the tilt direction to adjust the surface position of the wafer W via the driving unit 21, so that the pattern surface of the reticle R and the surface of the wafer W are conjugate with respect to the projection optical system PL and the image forming surface of the projection optical system PL coincides with the surface of the wafer W (the surface of the wafer W is within the depth of focus range of the best image forming plane of the projection optical system PL). Then, in a state where position setting and focusing are completed in this manner, the illumination light EL emitted from the illumination unit ILU is illuminated onto the pattern area PA of the reticle R with almost uniform illuminance, and a reduced image of the pattern of the reticle R is formed via the projection optical system PL on the wafer W which surface is coated with a photoresist.

Furthermore, in this embodiment, a multiple focal position detection system is arranged. This system is one of a focal detection system based on the oblique incident method, and the position of the wafer W surface is detected in the Z direction (direction of the optical axis AX) with respect to a virtual surface (reference surface) serving as a reference and parallel to the XY plane, when the wafer W is positioned within the projection area of the pattern by the projection optical system PL (the area on the wafer W corresponding to this projection area will hereinafter be referred to as the "exposure area"). As is shown in FIG. 1, the multiple focal position detection system comprises an irradiation system 74 which irradiates many image forming lights from a direction incident by a predetermined angle with respect to the optical axis AX on the wafer W surface, and a photodetection system 76 which individually photo-detects the image forming lights reflected off the wafer W surface.

More particularly, as is shown in FIG. 5, the irradiation system 74 has an arrangement including: an optical fiber bundle 81; a condenser lens 82; a pattern forming plate 83; a lens 84; a mirror 85; an irradiation objective lens 86, and the like. In addition, the photodetection system 76 has an arrangement including: a condenser objective lens 87; a rotational direction vibration plate 88; an image forming lens 89; a photodetection slit plate 98; a photodetection unit 90 having many photodetection sensors, and the like.

The operation of each portion making up the multiple focal position detection system (74, 76) will now be described. The illumination light IL having a wavelength different from the exposure light so that it does not expose the photoresist on coated on the wafer W is guided from the illumination light source (not shown in Figs.) via the optical fiber bundle 81. The illumination light emitted from the optical fiber bundle 81 passes though the condenser lens 82 and then illuminates the pattern forming plate 83. The illumination light (light) IL having passed through the pattern forming plate 83 is projected on the wafer W surface via the lens 84, the mirror 85, and the irradiation objective lens 86, and the image of the pattern formed on the pattern forming plate 83 is projected and formed on the surface of the wafer W. The illumination light (light of the pattern image) IL reflected off the wafer W passes through the condenser objective lens 87, the rotational direction vibration plate 88, and the image forming lens 89 and re-forms the image on the photodetection slit plate 98 which is arranged before the photodetection unit 90. The photodetection unit 90 has a plurality of photodetection sensors such as photodiodes that individually photo-detect the catoptric light of the plurality of pattern images projected on the wafer W, and on the photodetection slit plate 98 slits corresponding to the respective photodetection sensors are arranged. Accordingly, the light of the pattern image re-formed on the photodetection slit plate 98 is detected with each photodetection sensor via each slit, and the detection signals from each sensor (photoelectric conversion signals) are supplied to a signal processing unit 91 via a sensor selection circuit 93.

The main controller 28 provides vibration to the rotational direction vibration plate 88 via a vibration activating unit (for example, a vibrator or an ultrasonic oscillator or the like). Since the rotational direction vibration plate 88 vibrates all the light of each pattern image reflected off the wafer W, each pattern image re-formed on the photodetection slit plate 98 and each photodetection element are relatively vibrating. The signal processing unit 91 performs synchronous detection on each detection signal from a plurality of photodetection elements on the photodetection unit 90 selected by the sensor selection circuit 93 with the vibration signal of the vibration activating unit 92 to obtain focus signals (S curve signals), and then sends the focus signals to the main controller 28.

When the surface of the wafer W coincides with a reference surface (for example, the image forming plane of the projection optical system PL), the main controller 28 performs calibration of each photodetection sensor in advance, such as adjusting the angle of the plane-parallel plate glass (not shown in Figs.) arranged before the slit plate 98 or electrically providing an offset to the focus signal value, so that each focus signal amounts to 0.

Figure 6A:
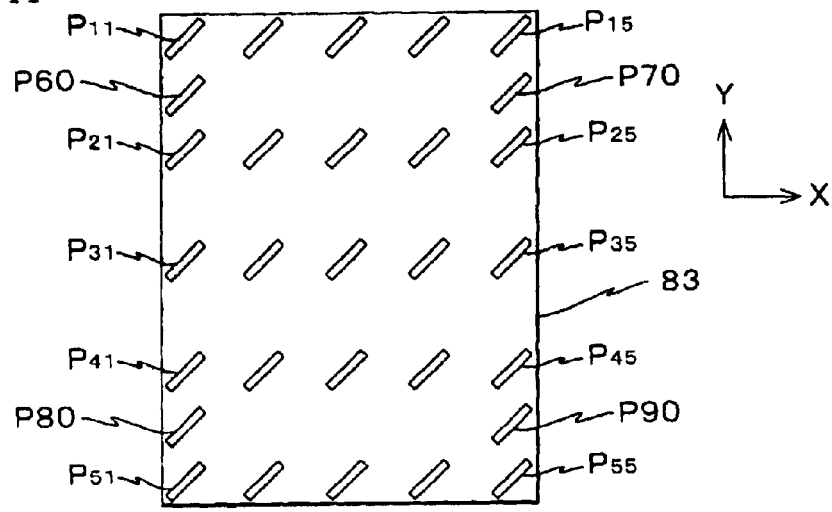
FIG. 6A is a planar view showing an example of the pattern forming plate.

FIG. 6A shows the pattern forming plate 83. As is indicated in FIG. 6A, on the pattern forming plate 83, in an arrangement of a 5 row 5 column matrix, 25 aperture patterns (5×5=25) $P_{11}$–$P_{55}$ are formed. In this case, the interval between the adjacent aperture patterns in the column direction (the lateral direction in FIG. 6A) is D1, and the interval between the adjacent aperture patterns in the row direction (the longitudinal direction in FIG. 6A) is D2 (>D1). For example, D2=1.35×D1. In addition, in FIG. 6A, an aperture pattern P60 is formed, in between the aperture pattern $P_{11}$ located in the first row first column and the aperture pattern $P_{21}$ located in the second row first column. Also, an aperture pattern P70 is formed, in between the aperture pattern $P_{15}$ located in the first row fifth column and the aperture pattern $P_{25}$ located in the second row fifth column. Further, an aperture pattern P80 is formed, in between the aperture pattern $P_{41}$ located in the fourth row first column and the aperture pattern $P_{51}$ located in the fifth row first column. And, an aperture pattern P90 is formed, in between the aperture pattern $P_{45}$ located in the fourth row fifth column and the aperture pattern $P_{55}$ located in the fifth row fifth column. Thus, on the patter forming plate 83, a total of 29 aperture patterns are formed.

These aperture patterns are slit-shaped, having an angle of 45 degrees against the direction of the four sides of the pattern forming plate 83 (X, Y directions), and the images of these aperture patterns are projected on the projection area of the reticle pattern by the projection optical system PL (exposure area) on the surface of the wafer W.

In this embodiment, the image light (light of the pattern image) from the irradiation system 74 is irradiated on the wafer W surface (or on the surface of the fiducial mark plate FM) from an oblique direction at a predetermined angle α with respect to the optical axis AX within an XZ plane. Of the image light, the light reflected off the wafer W proceeds in a direction symmetrically oblique to the image light from the irradiation system 74 at a predetermined angle α with respect to the optical axis AX within an XZ plane, and is detected by the photodetection system 76, as is previously described. That is, the image light from the irradiation system 74 and its catoptric light moves along the X-axis from one end to the other, when viewed from above.

Figure 6B:
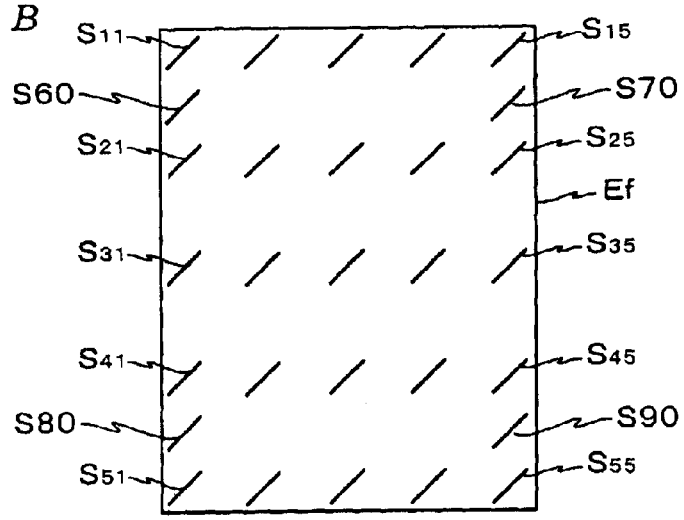
FIG. 6B is a view showing an arrangement of a pattern image on the surface of the wafer corresponding to the pattern forming plate in FIG. 6A.

Therefore, within the exposure area Ef on the surface of the wafer W, as is shown in FIG. 6B, a first irradiation point of a first light having passed through the aperture patterns $P_{11}$–$P_{55}$ that are a total of 25 slit shaped aperture patterns arranged in a 5×5 matrix tilted in 45 degrees with respect to the X-axis and Y-axis is formed. And at each first irradiation point, an image of each of the aperture patterns $P_{11}$–$P_{55}$ (hereinafter referred to as a "slit image" as appropriate), $S_{11}$–$S_{55}$ is formed. In this case, the exposure area Ef is an area of the size 25 mm×33 mm, and within this exposure area Ef the slit images $S_{11}$–$S_{55}$ are formed in a 5 row 5 column matrix. The interval between the adjacent slit images in the column direction (the lateral direction in FIG. 6B) is d1 (d1 is, for example, 5.8 mm), and the interval between the adjacent slit images in the row direction (the longitudinal direction in FIG. 6B) is d2 (d2 is, for example 7.8 mm).

In the multiple focal position detection system (74, 76) in this embodiment, the slit images $S_{11}$–$S_{55}$ described above are used to obtain the deviation amount in the direction of the optical axis AX (Z-axis direction) between the wafer W and a predetermined reference surface, such as the image forming plane of the projection optical system PL, that is, to obtain the Z position of the wafer W, with the respective center points serving as the measurement points.

In addition, as is shown in FIG. 6B, a second light having passed through the aperture pattern P60 forms a second irradiation point in between the slit images $S_{11}$ and $S_{21}$ on the surface of the wafer W, and forms a slit image S60 at the second irradiation point. Likewise, the second light having passed through the aperture pattern P70 forms the second irradiation point in between the slit images $S_{15}$ and $S_{25}$ on the surface of the wafer W, and forms a slit image S70 at the second irradiation point. Also, the second light having passed through the aperture pattern P80 forms the second irradiation point in between the slit images $S_{41}$ and $S_{51}$ on the surface of the wafer W, and forms a slit image S80 at the second irradiation point. And, the second light having passed through the aperture pattern P90 forms the second irradiation point in between the slit images $S_{45}$ and $S_{55}$ on the surface of the wafer W, and forms a slit image S90 at the second irradiation point.

The slit images S60–S90 are almost the same size as the respective slit images $S_{11}$–$S_{55}$, and are likewise tilted by 45° with respect to the X-axis and the Y-axis. The respective center points of the slit images $S_{11}$–$S_{51}$ in the first column, the center point of the slit image S60, and the center point of the slit image S80 are all arranged on the same line, the line being parallel to the Y-axis. In addition, the center point of the slit image S60 is located at the mid point between the center point of the slit image $S_{11}$ and the center point of the slit image $S_{21}$. And, the center point of the slit image S80 is located at the mid point between the center point of the slit image $S_{41}$ and the center point of the slit image $S_{51}$.

Similar as above, the respective center points of the slit images $S_{15}$–$S_{55}$ in the fifth column, the center point of the slit image S70, and the center point of the slit image S90 are all arranged on the same line, the line being parallel to the Y-axis. In addition, the center point of the slit image S70 is located at the mid point between the center point of the slit image $S_{15}$ and the center point of the slit image $S_{25}$. And, the center point of the slit image S90 is located at the mid point between the center point of the slit image $S_{45}$ and the center point of the slit image $S_{55}$.

As is described earlier, the light that forms the slit images $S_{11}$–$S_{55}$, S60, S70, S80, and S90 is irradiated obliquely with respect to the surface of the wafer W, with the XZ plane serving as the incident plane with respect to the wafer W. Accordingly, when the Z position (height position) of the wafer W changes, the irradiation position of each slit image moves along the X-axis direction (in the direction of the slit images in the same row, for example, the direction in which the slit images $S_{15}$—$S_{15}$ are arranged)

In this embodiment, 5×5 (=25) slit images are arranged for focal position detection within the exposure area Ef, however, if the slit images are arranged within the entire area of the exposure area Ef at a substantially equal interval, the number of the slit images may be of any number.

Figure 6C:
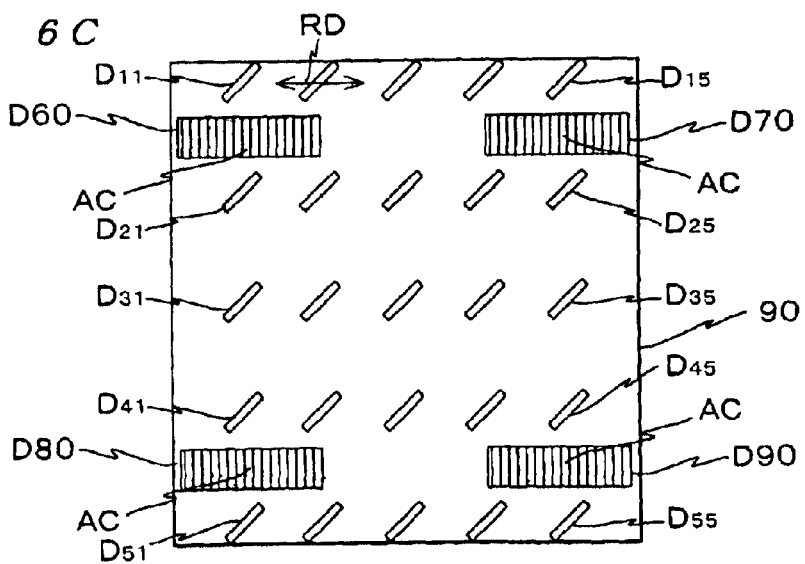
FIG. 6C is a view showing the photodetection sensors corresponding to the pattern forming plate in FIG. 6A.

FIG. 6C shows the photodetection unit 90 of the multiple focal position detection system (74, 76). On the photodetection unit 90, photosensors $D_{11}$–$D_{55}$ serving as a first photodetection sensor made up of a five row five column matrix of photodiodes are arranged. These photosensors $D_{11}$–$D_{55}$ are respectively arranged having a 45 degrees tilt with respect to the X-axis and the Y-axis. And corresponding to the photosensors, on the photodetection slit plate 98 arranged in front of the photodetection unit 90 (the lower surface in FIG. 1), slits that have a 45 degrees tilt with respect to the X-axis and the Y-axis are respectively formed facing the photosensors $D_{11}$–$D_{55}$. This keeps light other than the reflection light (such as stray light) of the slit images $S_{11}$–$S_{55}$ from entering the photosensors $D_{11}$–$D_{55}$.

In this case, on the slits arranged on the photodetection slit plate 98 facing the photosensors $D_{11}$–$D_{55}$, slit images $S_{11}$–$S_{55}$ shown in FIG. 6B are respectively re-formed. And, by rotationally vibrating the light reflected off the surface of the wafer W with the rotational direction vibration plate 88, on the photodetection slit plate 98, the position of each re-formed slit image vibrates in the direction of the arrow RD in FIG. 6C. Accordingly, the detection signals of each photosensor $D_{11}$–$D_{55}$ are synchronously detected with the rotational vibration frequency signals by the signal processing unit 91, via the sensor selection circuit 93.

In addition, as shown in FIG. 6C, in between the photosensors $D_{11}$ and $D_{21}$, a tracking sensor D60 serving as a second photodetection sensor extending in the X-axis direction in a predetermined length is arranged. On the portion opposing this tracking sensor D60 on the photodetection slit plate 98, a narrow slit-shaped opening that extends in the X-axis direction corresponding to the tracking sensor D60 is formed. The tracking sensor D60 is an array sensor, for example, that has a plurality of photodetection areas in the direction of the photosensors $D_{11}$–$D_{15}$ arrangement (the X-axis direction). When the tracking sensor D60 receives the reflection light (the image light from the slit image) from the slit image S60, it outputs the detection signals to the signal processing unit 91, via the sensor selection circuit 93. And, with the center portion of the tracking sensor D60 serving as the reference position AC (hereinafter referred to as center position "AC"), the signal processing unit 91 then measures the deviation amount and the deviation direction between the photodetection position of the reflection light from the slit image S60 and the center position AC. Among the photosensors $D_{11}$–$D_{55}$, the center position AC is located on a straight line passing through the center point of the photosensors $D_{11}$–$D_{55}$ arranged in the first column. That is, when the reflection light from the slit image S60 is irradiated on the center point of the tracking sensor D60, the Z position of the wafer W almost coincides with the best focal position at the irradiating point where the slit image S60 is formed.

Likewise as above, as is shown in FIG. 6C, in between the photosensors $D_{15}$ and $D_{25}$, $D_{41}$ and $D_{51}$, and $D_{45}$ and $D_{55}$, tracking sensors D70, D80, and D90, serving as a second photodetection sensor extending in the X-axis direction in a predetermined length, are respectively arranged. As these tracking sensors D70, D80, and D90, array sensors that have a structure identical with the photosensor D60 are used. And, on the portion opposing these tracking sensors D70, D80, and D90, on the photodetection slit plate 98, narrow slit-shaped openings that extend in the X-axis direction corresponding to the tracking sensors D70, D80, and D90, are respectively formed. When these tracking sensors D70, D80, and D90 receive the reflection light (the image light from the slit image) from the slit images S70, S80, and S90, they output the detection signals to the signal processing unit 91, via the sensor selection circuit 93. Then, the signal processing unit 91 measures the deviation amount and the deviation direction between the photodetection position of the reflection light from the slit images S70, S80, and S90 and the respective center position AC of the tracking sensors. The center position AC of the tracking sensor D80 is located on a straight line passing through the center point of the photosensors $D_{11}$–$D_{51}$ arranged in the first column. In addition, the center position AC of the tracking sensor D70 and D90 is located on a straight line passing through the center point of the photosensors $D_{15}$–$D_{55}$ arranged in the fifth column. Accordingly, when the reflection light from the slit images S70, S80, and S90 is irradiated on the center point of the tracking sensors D70, D80, and D90, the Z position of the wafer W almost coincides with the best focal position at the respective irradiating points where the slit images S70, S80, and S90 are formed.

Responding to the instructions from the main controller 28, among the n lines (n, for example, is 10) of the output lines (referred to as $O_1$–$O_n$) of the photoelectric conversion signals, the sensor selection circuit 93 outputs the detection signals from one of the four tracking sensors D60, D70, D80, and D90 consisting of the array sensors described earlier to a specific output line, for example $O_n$. The sensor selection circuit 93 is also a circuit, which individually outputs the detection signals of the selected (n−1) number of photosensors of the photosensors $D_{15}$–$D_{55}$, for example, 9 photosensors, to the remaining output lines $O_1$–$O_{n-1}$ respectively.

Within the signal processing unit 91, n numbers of signal processing circuits individually connected to each of the n output lines $O_1$–$O_n$ and a signal output circuit that digitally converts the output signals from these signal processing circuits and outputs them as serial data to the main controller 28 are arranged.

The main controller 28 is made up of a microcomputer (or a workstation) that includes a CPU (Central Processing Unit), a ROM (Read Only Memory), a RAM (Random Access Memory), an I/O interface, and the like, and totally controls each portion structuring the exposure system 100.

Along with the main controller 28, the input/output unit 29 is arranged. This input/output unit 29 includes a pointing device such as a keyboard and a mouse, and a display, and the like. The operator inputs various data via this input/output unit 29.

Next, focus leveling control of the wafer W, which is performed prior to exposure of the first shot on sequentially transferring the pattern of the reticle R to each shot area on the wafer W with the exposure system 100 having the arrangement described above in this embodiment, will be briefly described. As a premise, preparatory operations such as the reticle alignment, the baseline measurement of the alignment system ALG, and the wafer alignment are to be completed. In addition, the opening of the reticle blind 32 is to be set matching the size of the pattern area PA of the reticle R. Details on the preparatory operations of the reticle alignment, the baseline measurement, and the like referred to above, are disclosed in, for example, Japanese Patent Laid Open No. 04-324923, and the corresponding U.S. Pat. No. 5,243,195. The disclosures cited above are fully incorporated herein by reference.

In addition, as the wafer alignment referred to above, for example, EGA (Enhanced Global Alignment) is performed. EGA, as is disclosed in detail in, for example, Japanese Patent Laid Open No. 61-44429, and the corresponding U.S. Pat. No. 4,780,617, refers to an alignment method of obtaining the arrangement coordinates of each shot area on the wafer by measuring the position of the alignment marks provided along a plurality of specific shot areas (three or greater) selected in advance from a plurality of shot areas on the wafer, and performing a predetermined statistical calculation using the least squares method based on the measurement results and the designed arrangement coordinates of each shot area on the wafer. The disclosures cited above are fully incorporated herein by reference.

Figure 7A:
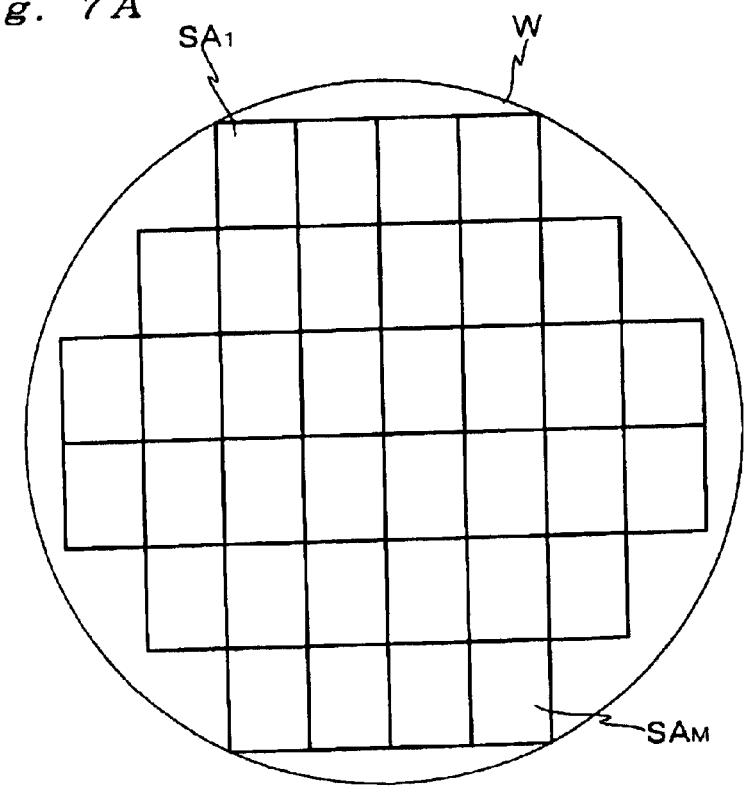
FIG. 7A is a view showing an example of an arrangement of the shot area formed on the wafer.

The case will first be described when shot areas $SA_m$ (m=1, 2, . . . , M) are formed on the wafer W, as is shown in FIG. 7A.

In this case, since none of the shot areas $SA_m$ is the so-called chipped shot, the main controller 28 sends instructions to the sensor selection circuit 93 to select an arbitrary sensor from the tracking sensors D60, D70, D80, and D90 and to select the photodetection sensor in accordance with the default setting, based on the shot map data stored in memory in advance or according to instructions input by the operator. With this operation, for example, the tracking sensor D60, the photosensors $D_{11}$, $D_{15}$, $D_{22}$, $D_{24}$, $D_{33}$, $D_{42}$, $D_{44}$, $D_{51}$, and $D_{55}$ are respectively connected to each of the ten signal output lines $O_1$–$O_{10}$ by the sensor selection circuit 93.

Then, the main controller 28 drives the X stage 58 and Y stage 56 via the wafer driving unit 21 based on the wafer alignment results, and sets the position of the first shot on the wafer W held by the substrate table 60 to the projection position of the reticle pattern.

And, when the illumination light IL is irradiated from the irradiation system 74, the slit images $S_{11}$–$S_{55}$ and S60–S90 are formed on the wafer W in the manner previously described. If, however, the surface of the wafer W is deviated to the +Z direction from the best focal position, the reflection light from the slit images $S_{11}$–$S_{55}$ and S60–S90 shifts to the left hand side in FIG. 6C on the photodetection slit plate 98 arranged in front of the photodetection unit 90. When the deviation amount of the surface of the wafer W in the +Z direction is smaller than a certain value, that is, if the shift amount of the reflection light from the slit images $S_{11}$–$S_{55}$ and S60–S90 on the photodetection slit plate 98 is smaller than the interval of the photosensors in the X-axis direction, none of the photosensors receives the image light of the slit images $S_{11}$–$S_{55}$. Whereas, in the case the deviation amount of the surface of the wafer W in the +Z direction almost coincides with the certain value referred to above, the image light of the slit images $S_{11}$–$S_{55}$ is incident on the respective photosensors arranged on the left side of the corresponding photosensors (hereinafter, this state will be referred to as a "pitch shift"). Thus, the photosensors D other than the photosensors arranged in the fifth column ($D_{15}$ $D_{25}$, $D_{35}$, $D_{45}$, and $D_{55}$) receive the reflection light from the slit images.

In either case described above, the reflection light from the slit image S60 is photo-detected at a photodetection area positioned from the center position AC of the tracking sensor D60 to the left in FIG. 6C, and the detection signals are output to the signal processing unit 91 via the sensor selection circuit 93. And in the manner described earlier, the signal processing unit 91 measures the deviation direction and the deviation amount between the photodetection position of the reflection light from the slit image S60 and the center position AC, and outputs the results to the main controller 28. The main controller 28 then servo controls the substrate table 60 so that the reflection light from the slit image S60 is located at the center position AC of the tracking sensor D60, and arranges the Z position of the wafer W in the vicinity of the best focal position.

On the other hand, if the surface of the wafer W is deviated to the –Z direction from the best focal position, the reflection light from the slit images $S_{11}$–$S_{55}$ and S60–S90 shifts to the right hand side in FIG. 6C on the photodetection slit plate 98 arranged in front of the photodetection unit 90. In this case as well, depending on the deviation amount, none of the photosensors receives the image light of the slit images $S_{11}$–$S_{55}$ or the photosensors D other than the photosensors arranged in the first column ($D_{11}$, $D_{21}$, $D_{31}$, $D_{41}$, and $D_{51}$) receive the reflection light from the slit images (a pitch shift state). Whether each slit image is photo-detected by the corresponding photosensor or is photo-detected by an adjacent, different photosensor obviously relates not only to the deviation amount of the wafer W with respect to the reference surface (corresponding to the image forming plane of the projection optical system) referred to earlier of the multiple focal position detection system, that is, to the problem of the shift amount of the slit images on the photodetection slit plate 98 and the photosensors, but also relates in actual to the vibration range of the slit images due to the vibration plate 88.

In either case described above, the reflection light from the slit image S60 is photo-detected at a photodetection area positioned from the center position AC of the tracking sensor D60 to the right, and the detection signals are output to the signal processing unit 91 via the sensor selection circuit 93. And in the manner described earlier, the signal processing unit 91 measures the deviation direction and the deviation amount between the photodetection position of the reflection light from the slit image S60 and the center position AC, and outputs the results to the main controller 28. The main controller 28 then servo controls the substrate table 60 so that the reflection light from the slit image S60 is located at the center position AC of the tracking sensor D60, and arranges the Z position of the wafer W in the vicinity of the best focal position.

When the Z position of the wafer W is adjusted in this manner, the slit images $S_{11}$–$S_{55}$ for detecting the Z position are respectively re-formed on the corresponding photosensors $D_{11}$–$D_{55}$. In this case, however, since only the photosensors $D_{11}$, $D_{15}$, $D_{22}$, $D_{24}$, $D_{33}$, $D_{42}$, $D_{44}$, $D_{51}$, and $D_{55}$ are selected, these photosensors respectively output detection signals to the signal processing unit 91 shown in FIG. 5. The signal processing unit 91 outputs focus signals corresponding to the respective detection signals to the main controller 28. The main controller 28 then measures the Z position of each measurement point selected based on each focus signals, and based on these Z positions, for example, obtains a virtual plane of an area on the wafer W and controls the Z position and the tilt with respect to the XY plane of the substrate table 60 via the wafer driving unit 21 so that the shot areas on the wafer W (coincides with the exposure area Ef) coincide with the best focal position. That is, in this manner, focus leveling control on the wafer W is performed.

As is described, in the embodiment, the deviation amount and the direction of deviation of the Z position of the wafer W from the best focal position can be simultaneously obtained, and even when the pitch shift occurs, it is possible to swiftly arrange the wafer surface in the vicinity of the best focal position.

Incidentally, by elongating the tracking sensors D60, D70, D80, and D90 in the X-axis direction, the Z position of the wafer W surface can be swiftly moved to the vicinity of the best focal position, even when the positional shift of the reflection light from the slit images $S_{11}$–$S_{15}$ becomes larger than the interval of photosensors in the X-axis direction.

And, the main controller 28 opens the shutter arranged within the illumination unit ILU and irradiates the reticle R with the illumination light EL for exposure, so as to transfer the pattern of the reticle R onto the first shot of the wafer W.

The main controller 28, then transfers the pattern of the reticle R, while controlling the movement of the Y stage 56 and X stage 58 and sequentially setting the position of the shot area from the second shot onward to the projection area of the reticle pattern. From the second shot onward as well, likewise with the case of the first shot, it is possible to perform focus leveling control using the tracking sensor. However, since the wafer surface almost coincides with the best focal position when the first shot is exposed, in the case of performing exposure from the second shot onward the amount of deviation of the wafer W surface from the best focal position is not large. Accordingly, when exposure is performed from the second shot and onward, the operation of arranging the wafer surface in the vicinity of the best focal position using the tracking sensors referred to above will not be necessary, and only focus leveling control may be performed using the photosensors above.

Figure 7B:
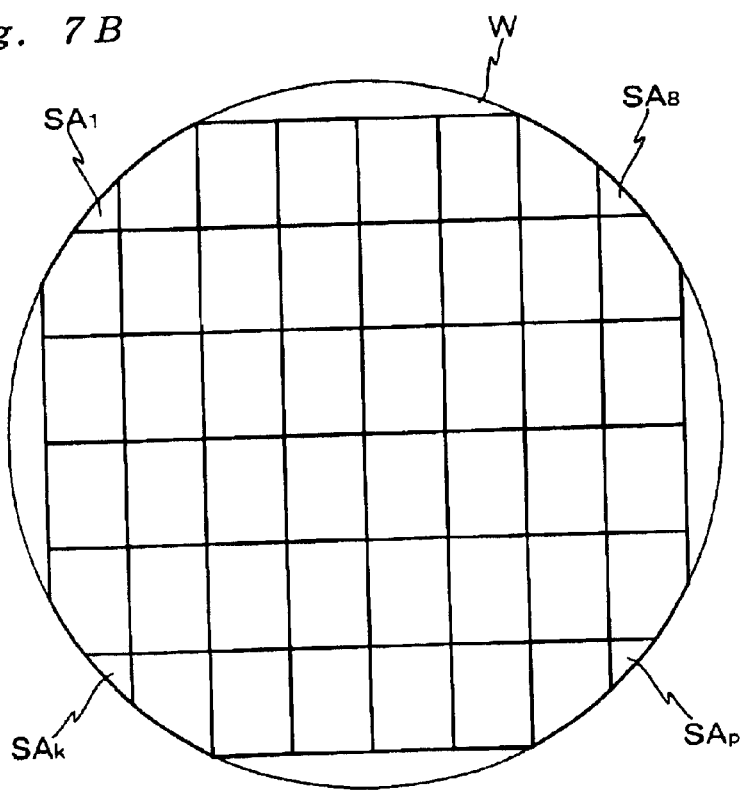
FIG. 7B is a view showing another example of an arrangement of the shot area formed on the wafer.

Next, the case will be described when shot areas $SA_m$ (m=1, 2, . . . , P) are formed on the wafer W, as is shown in FIG. 7B. In this case, a part of the shot areas $SA_m$ are the so-called chipped shots. And in this case, the probability is high that the first shot will be selected from the four chipped shot areas $SA_1$, $SA_g$, $SA_k$, and $SA_p$. When the shot area $SA_1$ is set as the first shot, the main controller 28 sends instructions to the sensor selection circuit 93 to select the tracking sensor D90, based on the shot map data stored in memory in advance or according to instructions input by the operator. Or, in the case when the shot area $SA_g$ is set as the first shot, the main controller 28 similarly sends instructions to the sensor selection circuit 93 to select the tracking sensor D80. And, in the case when the shot area $SA_k$ is set as the first shot, the main controller 28 similarly sends instructions to the sensor selection circuit 93 to select the tracking sensor D70. Finally, in the case when the shot area $SA_p$ is set as the first shot, the main controller 28 similarly sends instructions to the sensor selection circuit 93 to select the tracking sensor D60. In addition, in all cases, the main controller 28 sends instructions to the sensor selection circuit 93 to select the photodetection sensor in accordance with the default setting.

With this operation, the sensor selected by the sensor selection circuit 93 from the tracking sensors D60, D70, D80, and D90 is connected to the signal output line $O_{10}$, and the photosensors $D_{11}, D_{15}, D_{22}, D_{24}, D_{33}, D_{42}, D_{44}, D_{51}$, and $D_{55}$ are respectively connected to the remaining nine signal output lines $O_1$–$O_9$.

Next, similar as above, the main controller 28 drives the X stage 58 and Y stage 56 via the wafer driving unit 21 based on the wafer alignment results, and sets the position of the first shot on the wafer W held by the substrate table 60 to the projection position of the reticle pattern. And in the same manner as is previously described, the detection signals of the selected tracking sensor (a predetermined sensor among the sensors D60, D70, D80, and D90) are output to the signal processing unit 91 via the sensor selection circuit 93. The signal processing unit 91, likewise as above, measures the deviation direction and the deviation amount of the photodetection position of the reflection light from the slit image corresponding to the selected tracking sensor from the center position AC, and outputs the results to the main controller 28. The main controller 28 then servo controls the substrate table 60 so that the reflection light from the slit image is located at the center position AC of the selected tracking sensor, and arranges the Z position of the wafer W in the vicinity of the best focal position.

Hereinafter, the same operation is performed as when each exposure area on the wafer W shown in FIG. 7A is exposed. And, as is described, in this embodiment, it is possible to arrange the wafer surface in the vicinity of the best focal position without any problems, even if a chipped shot is set as the first shot on the wafer W wherever the shot may be.

Figure 8A:
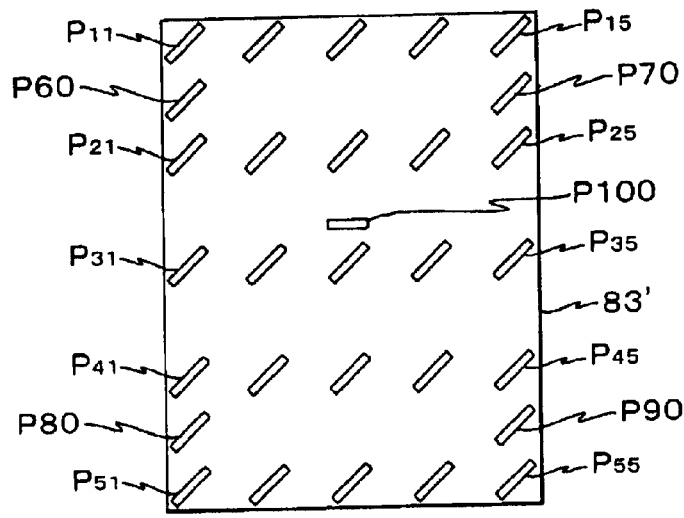
FIG. 8A is a planar view showing a modified example of the pattern forming plate.

FIG. 8A shows a modified example of the pattern forming plate within the irradiation system 74. On the pattern forming plate 83' shown in FIG. 8A, besides the aperture patterns $P_{11}$–$P_{55}$ and P60–P90, an aperture pattern P100 is formed in between the aperture pattern $P_{23}$ of the second row third column and the aperture pattern $P_{33}$ of the third row third column.

Figure 8B:
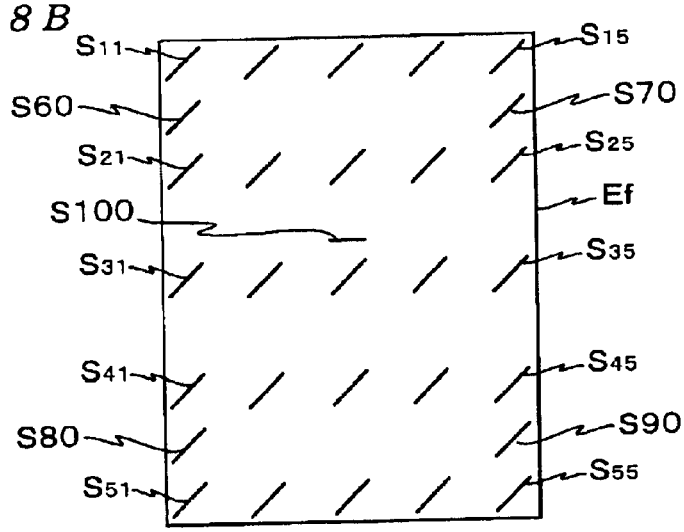
FIG. 8B is a view showing an arrangement of a pattern image on the surface of the wafer corresponding to the pattern forming plate in FIG. 8A.

FIG. 8B shows the slit images formed within the exposure area Ef on the wafer W surface when the pattern forming plate 83' shown in FIG. 8A is used. In this case, other than the slit images S11–S55 of the aperture patterns $P_{11}$–$P_{55}$ and the slit images S60–S90 of the aperture patterns P60–P90, the slit image S100 of the aperture pattern P100 is formed.

Figure 8C:
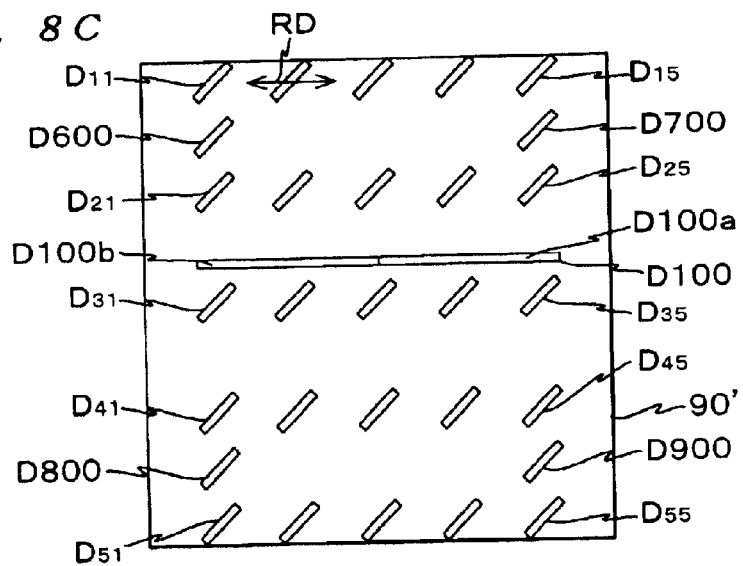
FIG. 8C is a view showing the photodetection units corresponding to the pattern forming plate in FIG. 8A.

FIG. 8C shows a modified example of the photodetection unit 90' arranged within the photodetection system 76 corresponding to the pattern forming plate 83' in FIG. 8A. On the photodetection unit 90' shown in FIG. 8C, instead of the tracking sensors D60–D90 indicated in FIG. 6C, tracking sensors D600–D900 serving as a second photodetection sensor having an arrangement identical to the photosensors $D_{11}$–$D_{55}$ are arranged. Similar to the tracking sensors D60–D90 in FIG. 6C, these tracking sensors D600–D900 are used to detect the "pitch shift", however these tracking sensors D600–D900 detect whether there is a "pitch shift" or not by detecting whether the reflection light from the slit images S60–S90 on the wafer W surface is incident on the respective sensors, and only when the reflection light from the slit images S60–S90 is incident, output detection signals. Furthermore, on the photodetection unit 90' in FIG. 8C, a direction differentiation sensor D100 is arranged in between the photosensors $D_{21}$–$D_{25}$ of the second row and the photosensors $D_{31}$–$D_{35}$ of the third row, as a sensor to photodetect the reflection light from the slit image S100. The direction differentiation sensor D100 extends in the direction of the photosensors of the same row, such as in the direction of the photosensors $D_{21}$–$D_{25}$ arranged (the horizontal direction in FIG. 8), and the length of the direction differentiation sensor D100 is, for example, almost the same as the interval between the photosensor $D_{21}$ and the photosensor $D_{25}$. In addition, the direction differentiation sensor D100 is divided into two portions; photodetection area D100a and photodetection area D100b, with the center point in the longitudinal direction as the border. When the direction differentiation sensor D100 detects the reflection light from the slit image S100, it distinguishes whether the wafer W surface is deviated in the +Z direction or in the −Z direction with respect to the image forming plane of the projection optical system PL. For example, when the reflection light from the slit image S100 is incident on the photodetection area D100a, the direction differentiation sensor D100 outputs detection signals to warn that the wafer W surface has deviated in the −Z direction, and when the reflection light from the slit image S100 is incident on the photodetection area D100b, it outputs detection signals to warn that the wafer W surface has deviated in the +Z direction.

In the case of using the pattern forming plate 83' in FIG. 8A and the photodetection unit 90' in FIG. 8C, the main controller 28 adjusts the Z position of the wafer W surface based on the output of the direction differentiation sensor D100, and also checks whether the "pitch shift" has occurred or not, based on whether or not a detection signal from at least one sensor selected from the tracking sensors D600–D900 can be detected. Accordingly, the Z position of the wafer W surface can be swiftly moved to the vicinity of the best focal position so that the reflection light from the slit images $S_{11}$–$S_{55}$ are respectively incident on the corresponding photosensors $D_{11}$–$D_{55}$. When the Z position of the wafer W surface moves to the vicinity of the best focal position, the main controller 28 controls the Z drive (and the tilt with respect to the XY plane) of the substrate table 60 based on the detection signals from at least one photosensor selected from the photosensors $D_{11}$–$D_{55}$, and adjusts the positional relationship between the wafer W surface and the best image forming plane of the projection optical system PL. Similar to the earlier case when using the pattern forming plate 83 and the photodetection unit 90, in the case of using the pattern forming plate 83' and the photodetection unit 90' related to the modified examples in FIG. 8A and FIG. 8C the tracking sensor D600–D900 may be partially selected and used, according to the position of the shot area subject to exposure on the wafer W.

Next, the case will be described when mix-and-match with the scanning exposure apparatus is performed, using the exposure system 100 in the embodiment.

Figure 9:
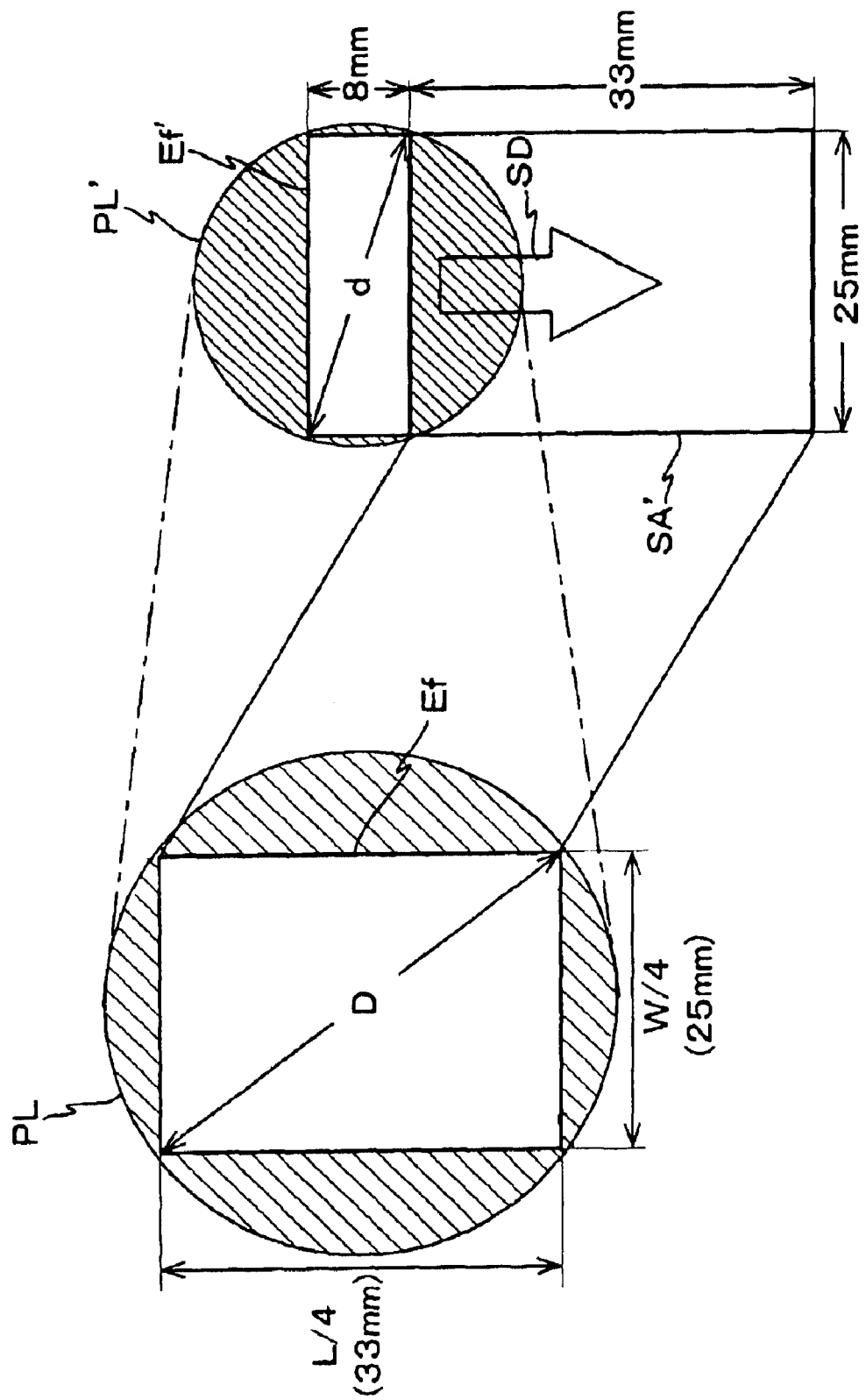
FIG. 9 is a view for explaining an example when mix-and-match is performed with a scanning exposure apparatus and the exposure apparatus according to the present embodiment.

In this case, a KrF scanner which exposure area Ef' is 25 mm×8 mm and has a rectangular shot area (divided area) SA' of the size 25 mm×33 mm as is shown in FIG. 9, is used as the scanning exposure apparatus. This KrF scanner comprises a projection optical system PL' which image field on the wafer side is circular with a diameter of $d=(8^2+25^2)^{1/2} \approx 26.25$ mm. FIG. 9 indicates that the exposure area Ef' is to be scanned in the direction of the arrow SD, however, in actual, the exposure area Ef' is fixed, and the wafer W is scanned in the direction opposite to the arrow SD.

In this case, as is obvious from FIG. 3, the size of the exposure area Ef of the exposure system 100 in the embodiment coincides with the size of the shot area SA' of the KrF scanner. Therefore, when mix-and-match is performed, different from the conventional i-line stepper, it becomes possible to perform the so-called 1 in 1 exposure. As a matter of course, in the mix-and-match, the KrF scanner is used for exposure on a critical layer, and for exposure on a middle layer which line and space is 0.3 μm and over or exposure on a non-critical layer (rough layer) the exposure system 100 is used. With the exposure system 100 in the embodiment, it is possible to achieve a high throughput of 120 slices per hour when exposing a 200 mm wafer.

A series of processing operations performed by the exposure apparatus 10 will be described next, focusing on the flow chart in FIG. 10 which shows the control algorithm of the main controller 28 (or the CPU, to be more specific) and referring to other drawings when necessary.

Figures 11, 12:
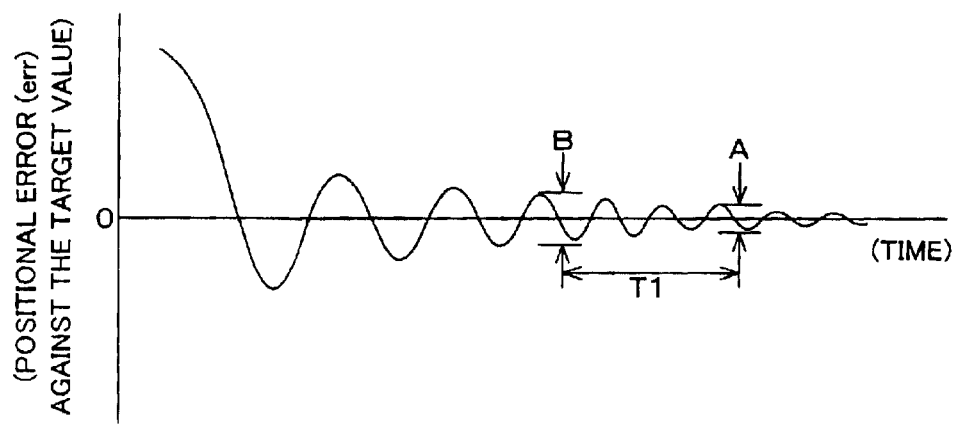
FIG. 11 is a view showing an example of a data table when the throughput control parameter is set with respect to 2 modes, a mode when the minimum line width subject to exposure 1 is 0.3 μm and over and less than 0.7 μm and a mode when the minimum line width subject to exposure 1 is 0.7 μm and over.
FIG. 12 is a view for explaining the reason to set the X, Y permissible values in FIG. 11 by modes, showing a temporal change of positional error against target values of the X stage and the Y stage (substrate table) after deceleration is completed.

As a premise, a data table such as the one shown in FIG. 11 is to be made in advance, and is to be stored within the RAM of the main controller 28. A brief description on the data table in FIG. 11 will now be made. The minimum line width of the pattern subject to transfer on exposure (hereinafter referred to as "minimum line width subject to exposure" as appropriate) 1, implies to the line width of the pattern image transferred on the wafer W which pattern is a pattern having the minimum line width among the circuit patterns formed on the reticle R, and is a value indicating the exposure accuracy required. As is obvious from FIG. 11, in the embodiment, 2 modes are prepared; a mode which the minimum line width subject to exposure 1 is 0.3 μm and over and less than 0.7 μm (hereinafter referred to as "middle mode" for convenience), and a mode which the minimum line width subject to exposure 1 is 0.7 μm and over (hereinafter referred to as "rough mode" for convenience). And for each mode, control factors related to the throughput of the exposure system 100 are set, such as the X, Y permissible values, the Z permissible value, the number of screens for alignment measurement, the number of sample shots.

In FIG. 11, the X, Y permissible values are values for reference when judging the position setting settlement (whether the position setting has been completed or not) of the X stage 58 (substrate table 60) and the Y stage 56 on stepping operations between shots. The X, Y permissible values imply to the values on both ends that set the permissible range of positional error (err) in the X-axis direction and Y-axis direction against the target value (target position), or to the absolute value of error (the case when the permissible maximum value of the error on the plus side and minus side against the target value is the same). The reason for setting the X, Y permissible values by mode will now be explained with reference to FIG. 12.

During the stepping operations of the X stage 58 and Y stage 56 performed in between shots, the stages move so that after acceleration→constant movement→deceleration the stages move into a standstill state, and the velocity change is almost in a trapezoidal shape. FIG. 12 shows the temporal change of the positional error against the target value after deceleration has been completed. As is shown in FIG. 12, on position setting, the X stage 58 and Y stage 56 vibrate. Normally, position setting is judged complete when the positional error (err) against the target value falls within a predetermined permissible range. The permissible range, in general, is set by standard deviation, that is, the RMS value as a reference. And, as is obvious from FIG. 12, when the permissible range of the positional error (err) is set at the range indicated as B, the position setting is judged complete earlier, as much as the time T1, compared with when the permissible range of the positional error (err) is set at the range indicated as A, thus leading to an improvement in throughput. Therefore, in this embodiment, the X, Y permissible values are set by mode from the aspect of improving the throughput while maintaining the required exposure accuracy, by changing the X, Y permissible values and accordingly the permissible error range (refer to A, B in FIG. 12) set by these values, depending on the minimum line width subject to exposure 1, or in other words, the required exposure accuracy.

Referring back to FIG. 11, the Z permissible value is the permissible value of defocus upon exposure. That is, when the wafer W surface is made to coincide with the image forming surface (target surface) of the projection optical system PL based on the output of the multiple focal position detection system (74, 76), the Z permissible value implies to the values on both ends that set the permissible range of positional error (err) of the wafer W surface related to the optical axis direction (Z-axis direction) against the target surface, or to the absolute value of error (the case when the permissible maximum value of the error on the plus side and minus side against the target surface is the same). For example, in the case the minimum line width subject to exposure is fine and the required exposure accuracy is tight, the defocus amount allowed on exposure becomes extremely small. On the contrary, when the minimum line width subject to exposure 1 is not so fine and in the case the required exposure accuracy is moderate, the defocus amount allowed on exposure hardly affects the exposure accuracy even if it may be somewhat large. The pre-focusing time of the focus depends on the Z permissible value, therefore, the Z permissible value influences the throughput of the exposure system 100.

In FIG. 11, the number of screens for alignment measurement is the number of screens of the images picked up on alignment. FIA system sensors such as the alignment system ALG picks up images of a plurality of screens with respect to the same mark in order to detect the mark position, based on the average value of the image signals of the plurality of screens. So, by changing the number of screens of the images picked up, that is, by changing the number of screens for measurement, the measurement accuracy can be improved or reduced. The number of screens for measurement influences the measurement time.

In addition, the number of sample shots refers to the number of sample shots on EGA, which is to be performed prior to exposure of each layer from the second layer onward as was previously described and disclosed in, Japanese Patent Laid Open No. 61-44429, and the corresponding U.S. Pat. No. 4,780,617, and the like. Changing the number of sample shots means to change the positional alignment accuracy between the reticle and the wafer. Also, the number of sample shots influences the measurement time. And, instead of using the number of sample shots, the number of alignment marks to be detected by the EGA method on the wafer may be used, or combined with the number of sample shots.

Figure 10:
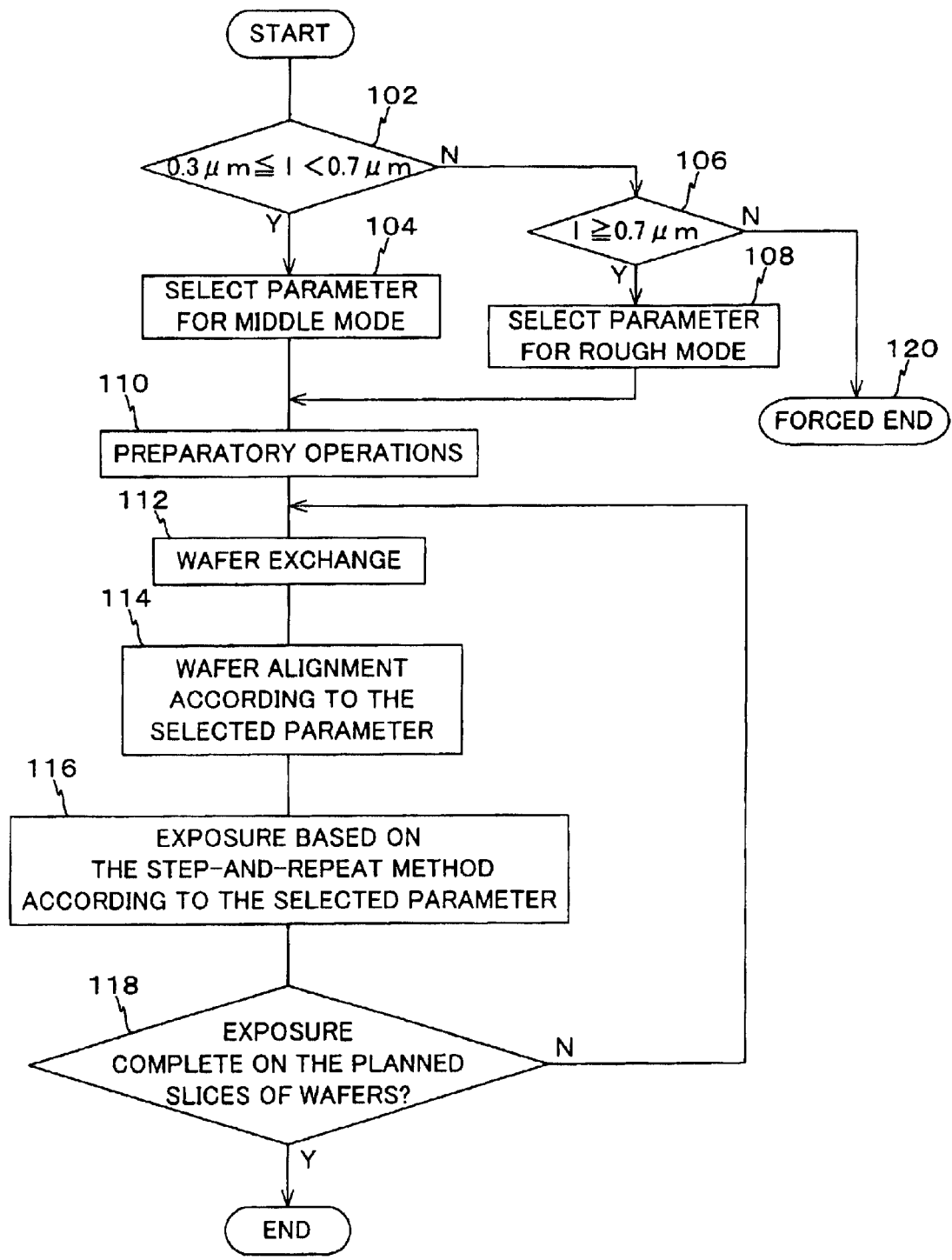
FIG. 10 is a flow chart showing a control algorithm of the main controller related to a series of processing operations of the exposure apparatus.

The control algorithm in FIG. 10 starts, after the minimum line width subject to exposure 1 is input and various inputs for setting other exposure conditions are completed via the input/output device 29 by the operator, when instructions to start is given.

First of all, in step 102, judgment on whether the minimum line width subject to exposure 1 satisfies the 0.3 μm≦1<0.7 μm stored in the predetermined storage area in the RAM or not. If, for example, the operator had input 1=0.35 μm as the minimum line width subject to exposure 1, then the judgment in step 102 results to be affirmative, therefore, the flow proceeds to step 104.

In step 104, according to the data table in FIG. 11 previously described, the middle mode parameter is selected. After this, the flow proceeds to step 110 and the predetermined preparatory operations referred to earlier such as the reticle alignment and the baseline measurement, and the setting of the opening of the reticle blind 32 in correspondence with the pattern area PA are performed under the predetermined procedures.

In the next step 112, wafer exchange (merely wafer loading, in the case no wafers are on the substrate table 60) is performed using the wafer loader (not shown in Figs.) and the delivery mechanism provided on the substrate table 60 (not shown in Figs.).

Next, in step 114, wafer alignment is performed based on the EGA method as described above. Upon the wafer alignment, positional measurement of the alignment marks is performed, with the number of sample shots being 12 and the number of screens for measurement when measuring each alignment mark provided on the sample shots being 5. And, based on the measurement result, that is, based on the positional information of each alignment mark that uses the index center of the alignment system ALG as a reference and the positional information of the substrate table 60 when measuring each alignment mark, the position of each alignment mark of the stage coordinate system (X, Y) is calculated. Then, based on this calculation result and the designed arrangement coordinates of each shot area on the wafer W, a predetermined statistical calculation using the least squares method is performed so as to obtain the arrangement coordinates of each shot area on the wafer W (the coordinates of the target position on position setting).

In the next step 116, exposure based on the step-and-repeat method is performed in the following manner, and the pattern of the reticle R is sequentially transferred onto each shot area on the wafer W.

That is, the first shot on the wafer W held by the substrate table 60 is positioned to the projection position of the reticle pattern by driving the X stage 58 and Y stage 56 via the wafer driving unit 21, based on the wafer alignment results obtained in step 114. In this case, the judgment on whether the position setting has been completed or not, is made when the positional error (err) in the X-axis direction and Y-axis direction against the target value falls within the range of ±0.1 $\mu$m. And almost simultaneously with the completion of this position setting, the illumination light IL is irradiated on the wafer W from the irradiation system 74 and focus leveling control previously described is performed under a predetermined procedure prior to exposure of the first shot. Upon this operation, the Z driving and the tilt with respect to the XY plane of the substrate table 60 are controlled via the wafer driving unit 21, so that the positional deviation of the first shot (coinciding with the exposure area) on the wafer W from the target surface which is the best focal position, in other words, the permissible amount of defocus, falls within the range of the predetermined error (±0.1 $\mu$m). The focus leveling control, in this case, is performed after the position setting of the wafer W has been completed, however, the focus leveling control may start before the position setting of the wafer W is completed, or at least the measurement using the multiple focal position detection system may begin during the stepping operations of the wafer.

Then, the shutter within the illumination unit ILU is opened so that the exposure light EL irradiates the reticle R, and the pattern of the reticle R is transferred onto the first shot on the wafer W.

After the first shot is completed, from the second shot onward, the reticle pattern is transferred likewise as above while the position setting of the shot area to the projection area of the reticle pattern is sequentially performed by driving and controlling the Y stage 56 and X stage 58. From the second shot onward as well, judgment on whether the position setting has been completed or not is made when the positional error (err) in the X-axis direction and Y-axis direction against the target value falls within the range of ±0.1 $\mu$m, and exposure begins when the defocus on focus leveling control falls within the range of the predetermined error (±0.1 $\mu$m).

And, when exposure on the wafer W is completed in this manner, the flow proceeds to step 118 and judges whether exposure on the planned slices of wafers has been completed or not. When this judgment turns out to be negative, the flow then returns to step 112, and repeats the process and judgment indicated in step 112–step 118. Finally, when exposure of the planned slices of wafer is completed, then the judgment in step 118 is affirmed, and the series of operations in this routine is completed.

Meanwhile, in the case the judgment in step 102 referred to earlier is negative, the flow then proceeds to step 106 and judges whether the minimum line width subject to exposure 1 satisfies I≧0.7 $\mu$m or not. If, for example, the operator had input 1=0.8 $\mu$m or the like as the minimum line width subject to exposure 1, then the judgment in step 106 results to be affirmative, therefore, the flow proceeds to step 108.

In step 106, according to the data table in FIG. 11 previously described, the rough mode parameter is selected. After this, the flow proceeds to step 110 and the predetermined preparatory operations referred to earlier are performed under the predetermined procedures. Then, the process and judgment indicated in steps 112–118 are repeatedly performed, until the judgment in step 118 turns affirmative. In this case, in step 114, wafer alignment is performed based on the EGA method as described above. And on the wafer alignment, positional detection of the alignment marks is to be performed with the number of sample shots being 3, and the number of screens for measurement of the alignment system ALG when measuring each alignment mark provided on the sample shots being 1. In addition, in step 116, similar to the previous description, exposure based on the step-and-repeat method is performed to sequentially transfer the pattern of the reticle R onto each shot area on the wafer W. And, judgment on whether the position setting has been completed or not on the stepping operation between shots is made when the positional error (err) in the X-axis direction and Y-axis direction against the target value falls within the range of ±1 $\mu$m. Also, focus leveling control performed prior to exposure is performed with the permissible value of defocus falling within the range of the predetermined error (±1 $\mu$m).

Meanwhile, if, in the case the operator had input 1=0.2 $\mu$m as the minimum line width subject to exposure 1, then the judgment in step 102 and the judgment in step 106 are sequentially denied, and the flow proceeds to step 120. In step 120, the line width input abnormality is shown on the display of the input/output device 29, and the end of procedure is forced. This is because with the exposure apparatus 10, the limit of resolution is the line width 0.3 $\mu$m, and finer patterns are not assumed as patterns subject to exposure. Accordingly, the cause of the line width input abnormality does not matter, whether it is a mere input mistake by the operator or whether the layer subject to exposure is actually a critical layer having a minimum line width less than 0.3 $\mu$m.

As is described, with the exposure apparatus 10 in this embodiment, the series of processes are performed according to the flow chart in FIG. 10. Consequently, in accordance with the required exposure accuracy on exposure (in this embodiment, the exposure accuracy is judged based on the minimum line width subject to exposure 1, as is previously described) the following items are changed in the manner in the description that follows: a. the X, Y permissible values of the substrate table 60, that is, the permissible value of the positional error (err) against the target value when judging the position setting settlement on the stepping operation in between shots; b. the Z permissible value, that is, the permissible value of defocus on focus leveling control; c. the number of screens for alignment measurement; and d. the number of sample shots on EGA.

That is, when the middle mode is selected where the required exposure accuracy is high and the position setting of the substrate table 60 needs to be performed with high precision, the main controller 28 sets small values for the X, Y permissible values, and waits for a sufficient time to settle the position setting of the substrate table 60 before going onto the next operation so that the exposure accuracy is high to the utmost. On the contrary, when the rough mode is selected where the required exposure accuracy is not high and the position setting of the substrate table 60 may be rough, the main controller sets large values for the X, Y permissible values, and shortens the position setting settlement time. Thus, the throughput can be improved, compared with when the X, Y permissible values were set at constant values regardless of the exposure accuracy required.

In addition, in the case the middle mode is selected where the required exposure accuracy is high, the permissible value of defocus upon exposure is set at a small value accordingly, and in the case of the rough mode where the required exposure accuracy is not that tight, the permissible value of defocus is more or less set loosely. As a consequence, compared with the former case, the pre-focusing time becomes shorter in the latter case, thus making it possible to reduce the exposure processing time compared with when the permissible value of defocus is set constant regardless of the exposure accuracy required. In this case, the exposure accuracy can be sufficiently maintained.

Also, when the middle mode is selected where the required exposure accuracy is high, the main controller 28 increases the number of sample shots on EGA, and when the rough mode is selected where the required exposure accuracy is not so tight, decreases the number of sample shots on EGA. As a result, the throughput can be improved, compared with when using the same number of sample shots regardless of the exposure accuracy required. And, the exposure accuracy can also be sufficiently maintained.

Furthermore, when the middle mode is selected where the required exposure accuracy is high, the main controller 28 increases the number of screens for alignment measurement, whereas, when the rough mode is selected where the required exposure accuracy is not so tight, decreases the number of screens for alignment measurement. As a result, the throughput can be improved due to the reduction in alignment time, compared with when using the same number of screens for alignment measurement regardless of the exposure accuracy required. And, the exposure accuracy can also be sufficiently maintained.

As is obvious from the description so far, in this embodiment, the surface position adjustment unit is structured including: the multiple focal position detection system made up of the irradiation system 74 and the photodetection system 76 (including the photosensors $D_{11}$–$D_{55}$, the tracking sensors D60, D70, D80, and D90 or the tracking sensors D600, D700, D800, and D900, and the direction differentiation sensor D100, and the like); the substrate table 60; the wafer driving unit 21; and the main controller 28, and the like.

As is described in detail, the exposure apparatus 10 in this embodiment comprises a projection optical system PL that has an image field large enough to expose, for example, a shot area (divided area) on the wafer of a KrF scanner in one shot by projecting the exposure light EL emitted from the reticle R on the wafer W in a state when the reticle R and wafer W are almost stationary. Therefore, on performing the mix-and-match previously described, shot areas on which exposure can be completed in one shot with the scanning exposure apparatus such as the KrF scanner, can be exposed in one shot. Accordingly, by the 1 in 1 exposure, the maximum range where the scanning exposure apparatus is capable of exposing can be set as the shot area, and thus the capability of the scanning exposure apparatus can be exhibited to the full. In addition, since the shot center is the same in the scanning exposure apparatus and the exposure apparatus 10, it is possible to suppress residual errors such as shot rotation or shot magnification due to overlay to the utmost.

Accordingly, in the case the lithographic process to manufacture a device such as a semiconductor includes an exposure process that uses a scanning exposure apparatus, by employing the mix-and-match with the exposure apparatus 10 in this embodiment, exposure with high accuracy and high throughput can be achieved.

In addition, with the exposure apparatus 10 in this embodiment, since the main controller 28 changes various throughput control factors such as the items a.–d. described above in the manner above according to the minimum line width subject to exposure 1 (required exposure accuracy), when exposure is performed on the same wafer the throughput can be obviously improved compared with when the exposure system 100 is controlled based on the same throughput control factors at all times. Meanwhile, since the throughput control factor is changed to a state where priority is put on throughput only in the case when the required exposure accuracy is not so high, in other words, when reduction in exposure accuracy is allowed to some extent, as a consequence, the exposure accuracy can be maintained at a sufficient accuracy level.

In the embodiment above, the case has been described when the main controller 28 changes the four throughput control factors; a. the X, Y permissible values of the substrate table 60, b. the Z permissible value, c. the number of screens for alignment measurement, and d. the number of sample shots on EGA in accordance with the minimum line width subject to exposure 1. The present invention, however, is not limited to this, and any one, any two, or any three of the items a.–d. may be changed according to the minimum line width subject to exposure. In such a case, the throughput can be improved. As a matter of course, high exposure accuracy can be maintained on exposure accuracy.

In addition, instead of, or in addition to the throughput control factors that has been described so far, the main controller 28 may change the following throughput control factors in accordance with the minimum line width subject to exposure 1: e. the permissible value of the physical quantity related to the position setting accuracy of the substrate table 60; f. the time until the position setting of the substrate table 60 is judged complete; g. the permissible value of heat quantity stored in the projection optical system PL due to the irradiation of the exposure light EL (the so-called E value limit); h. the permissible value of vibration quantity of the substrate table 60 during exposure; i. the permissible error of the exposure amount provided on the wafer; j. the physical quantity related to the alignment measurement accuracy of the wafer; and k. the on/off of automatic focusing on alignment measurement, and the like.

Item e.—the permissible value of the physical quantity related to the position setting accuracy of the substrate table 60—can include at least either the maximum permissible velocity or the maximum permissible acceleration on the stepping operation in between shots, besides the item a. previously described. For example, when the rough mode is selected, by increasing either the maximum permissible velocity (the stepping velocity) or the maximum permissible acceleration on the stepping operation in between shots from the values of the middle mode, the stepping time in between shots can be reduced, thus the time required for exposure processing on the wafer W (exposure processing time) can be reduced. However, when the stepping velocity increases, the absolute value of the acceleration/deceleration velocity normally increases since the stepping is performed at a higher speed in a limited distance (distance between shots). In this case, by changing the permissible value of positional error (err) against the target value to judge the settlement of position setting so as to match the increase in stepping velocity, it is possible to reduce the stepping time on exposure without increasing the position setting settlement time. This, however, does not necessarily have to be done, and the same permissible value of positional error (err) against the target value to judge the settlement of position setting may be used at all times if the velocity and acceleration/deceleration velocity (moving state) during the stepping operations of the substrate table 60 is changed in an extent so that the total throughput increases, in consideration of the exposure processing time reduced due to the improvement in the stepping velocity and the increase in the position setting settlement time.

In addition, item f. the time until the position setting of the substrate table 60 is judged complete, referred to above, refers to a predetermined time t. This predetermined time t is the time required until the state of the positional error (err) falls within the predetermined range. At this point, the position setting may be judged complete. When the rough mode is selected, the predetermined time t can be reduced, compared with the case when the middle mode is selected.

Also, the so-called E value limit in item g. above is included in the throughput control factor for the following reason. The image forming characteristics of the projection optical system PL changes due to the heat quantity stored in the system when it absorbs the illumination light, however the permissible range of the change in the image forming characteristics differs depending on the exposure accuracy required. In this case, when the heat quantity is stored to a level exceeding the permissible level, exposure has to be suspended so as to cool off the projection optical system. Thus, changing the E value limit affects the throughput. That is, when the rough mode is selected, the permissible range of the change in the image forming characteristics can be set larger than when the middle mode is selected, so the permissible value of the heat quantity stored in the projection optical system becomes larger.

And, the item h. the permissible value of vibration quantity of the substrate table 60 during exposure is included in the throughput control factor for the following reason. There is a fixed relationship between the minimum line width subject to exposure 1 and the stage vibration within the XY plane permissible during exposure. In general, when the minimum line width subject to exposure is fine, the stage vibration on exposure has to be small, or it will affect the exposure. On the contrary, when the minimum line width subject to exposure is not so fine, even if vibration may more or less occur upon exposure, it does not have an adverse effect on the exposure. In the latter case, by starting the next operation in a state before the vibration accompanying the movement of the substrate table has ceased completely, the total processing time can be reduced. That is, when the rough mode is selected, the permissible value of the vibration quantity of the substrate table 60 can be set larger than the middle mode.

In addition, item i. the permissible error of the exposure amount provided on the wafer is included in the throughput control factor for the following reason, although there are questions especially when the light source is a pulse light source since the energy per pulse fluctuates in this case. That is, the permissible error of the exposure amount provided on the wafer differs depending on the minimum line width subject to exposure, and the error of the exposure amount can be changed by changing at least either the number of the pulse emitted from the light source on exposure and irradiated on the wafer W or the repetition frequency (emitting cycle). In the case of using a pulse light source, since there is an energy fluctuation per pulse, the control accuracy of the exposure amount improves the more the number of the pulse irradiated on the wafer increases. On the other hand, when the number of the pulse irradiated on the wafer is reduced, the exposure amount control accuracy also is reduced, while the throughput is improved. Accordingly, if the target exposure amount is the same, in the case the rough mode is selected the number of the pulse irradiated on the wafer is decreased, compared with the case when the middle mode is selected. In addition, if the number of the pulse irradiated on the wafer is the same, then by increasing the repetition frequency, the time required for exposure can be reduced. Thus, in the case the rough mode is selected the repetition frequency of the pulse emission of the light source is to be higher than when the middle mode is selected.

Also, item j. the physical quantity related to the alignment measurement accuracy of the wafer, can include at least either the selection of sample shot on EGA measurement, that is, the measurement time of the alignment marks, or the quantity related to the selection of alignment marks to be measured. Changing the measurement time of the alignment marks is not limited to the method of changing item c. the number of screens for alignment measurement. In addition, as the quantity related to the selection of alignment marks, besides item d. the number of sample shots, it also includes determining the range of the shot areas on the selection range of the sample shots, within what range of the radius the shot areas should be with the wafer center serving as the radius center. If the range of the selection of the sample shots is small, the positional error of each shot set by the EGA measurement may be large, however, the movement time of the wafer for mark measurement is reduced so the time required for EGA measurement can be shortened. Therefore, when the rough mode is selected, the range of the selection of the sample shots is set smaller compared with when the middle mode is selected. The physical quantity of the item j. described above, may include the number of alignment marks on the wafer that is to be detected by the EGA measurement, such as the quantity related to the alignment mark numbers to be detected per each sample shot.

In addition, item k. the on/off of automatic focusing on alignment measurement, is included in the throughput control factor for the following reason. Normally, in many cases a focus detection system (a focal point detection system) is incorporated in the alignment system ALG such as the FIA system. In this case, when the automatic focusing of the wafer is performed on alignment mark detection with the focus detection system turned on, this itself improves the measurement accuracy of the alignment marks, however, the total time required for measurement increases. Thus, the on/off of the automatic focusing upon alignment measurement influences the throughput. So, the on/off maybe switched depending on the required exposure accuracy, or in other words, the minimum line width subject to exposure. That is, when the rough mode is selected, the automatic focusing is to be turned "off", whereas in the middle mode, it is to be turned "on".

Also, the throughput can be improved, when the interval between various calibrations of the target surface of the focal position detection system or the baseline (the positional relationship between the pattern projection position of the projection optical system PL and the detection center of the alignment system ALG) or the like is longer when the rough mode is selected, compared with when the middle mode is selected.

In the embodiment above, the case has been described where the main controller 28 changes the throughput control factors on its own judgment, based on the value of the minimum line width subject to exposure 1 input by the operator. The present invention, however, is not limited to this. For example, the parameter values related to the control factors used upon exposure may be individually set in the process program file, which is a file containing various parameters set in order to control the exposure system. In such a case, the operator individually sets various parameter values in the process program file in advance, and the control system controls the exposure system according to the process program file so that the control factors are changed on exposure in accordance with the minimum line width subject to exposure. Accordingly, a simple change in the conventional process program file is sufficient enough, and a new complicated exposure process program (software) including a judgment program does not have to be made.

Furthermore, the exposure system may be arranged so that the operator can manually select between the middle mode and rough mode. Or, the control system may pick up the information of the reticle R used for exposure during carriage with a bar-code reader or the like, and based on the information collected the control system may automatically judge the minimum line width subject to exposure.

In addition, as is disclosed in, for example, Japanese Patent Laid Open No. 07-122473, and the corresponding U.S. application Ser. No. 569,400 (application filed: Dec. 8, 1995), in some cases the alignment method of obtaining the magnification, rotation, and the like of the reticle via the projection optical system using a method similar to EGA on the reticle (mask) side is employed. And according to the minimum line width of the pattern subject to exposure, the number of the sample shots on the EGA may be changed so that the relative alignment accuracy between the mask and the substrate is changed. The disclosures cited above are fully incorporated herein by reference.

Also, on a surface of the glass substrate used as the reticle R in the exposure apparatus 10 in this embodiment, other than the circuit pattern it also includes the reticle alignment marks Rxy1–Rxy14 for the scanning exposure apparatus and the pair of reticle alignment marks Rx1y and Rx2θ normally used by the static type exposure apparatus. Therefore, when, for example, mix-and-match is performed, it is possible to use the reticle R in both the scanning exposure apparatus and the static type exposure apparatus. And, in the case of using the reticle R in the exposure apparatus 10 in this embodiment, since the pair of reticle alignment microscopes RA1 and RA2 is movable in the X-axis direction, it is possible to perform reticle alignment using the pair of reticle alignment marks Rxy13 and Rxy14 located in the center position along the Y-axis direction, among the provided reticle alignment marks Rxy1–Rxy14. Further, with the exposure apparatus 10 in this embodiment, since the pair of reticle alignment microscopes RA1 and RA2 is movable in the X-axis direction, it is possible to perform reticle alignment without any problems even when using a reticle (on which only reticle alignment marks for scanning exposure apparatus are formed) used in the scanning exposure apparatus.

In addition, on the reticle R, measurement patterns $MPMa_1$, $MPMb_1$, $MPMa_2$, $MPMb_2$, $MPMc_1$, $MPMc_2$, $MPMd_1$, and $MPMd_2$ are provided that are used for aerial image measurement on measuring the image forming characteristics of the projection optical system PL with the aerial image measurement unit based on the slit-and-scan method. Therefore, in the case of using the reticle R, it is not necessary to prepare a measurement reticle (test reticle) used solely for aerial image measurement on which measurement patterns are formed. Naturally, on aerial image measurement, it is necessary to change the position and size of the opening of the reticle blind 32 so that the only the periphery of each measurement pattern is illuminated with the exposure light EL.

Further, with the exposure apparatus in this embodiment, the irradiation system 74 structuring the focal position detection system (74, 76) forms the slit images S60, S70, S80, and S90 (the second irradiation point) for following the Z-position, each image formed close to the four corners of the projection area (exposure area) Ef on the wafer W, where the circuit pattern within the pattern area PA of the reticle R is projected. Also, in the exposure apparatus, tracking sensors D60, D70, D80, and D90 (or D600, D700, D800, and D900) are arranged that are capable of individually photodetecting the reflection light (slit image light) from each second irradiation point. Therefore, even if a part of the rectangular shape of the projection area is chipped, that is, even if the shot area subject to exposure is a chipped shot, at least one of the second irradiation points (one of the slit images S60, S70, S80, and S90) can be formed on the wafer W (shot area), and based on the output of the tracking sensor corresponding to the reflection light the main controller 28 moves the substrate table 60 and is able to arrange the wafer W held on the substrate table 60 in the vicinity of the best image forming plane of the projection optical system PL. Then, after the wafer W is arranged in the vicinity of the best image forming plane of the projection optical system PL, light from a plurality of the first irradiation points (slit images $S_{11}$–$S_{55}$) is individually received by the corresponding photosensors $D_{11}$–$D_{15}$. And, the main controller 28 drives and controls the substrate table in the optical axis direction so that the wafer W surface almost coincides with the best image forming plane of the projection optical system PL, based on the deviation signals from the selected photosensors. In this manner, even if the shot area subject to exposure is the so-called chipped shot, it is possible to swiftly adjust the positional deviation of the wafer W in the optical axis direction, and the wafer surface can be swiftly made to coincide with the best image forming plane of the projection optical system PL.

Accordingly, with the exposure apparatus 10 in this embodiment, arranging the so-called chipped shot on the wafer W does not cause any problems. Therefore, not only the arrangement of shot areas shown in FIG. 7A described earlier, but also the arrangement of shot areas shown in FIG. 7B becomes possible. As is obvious when comparing FIG. 7A and FIG. 7B, the area utility efficiency of the wafer can be improved, as well as increase the degree of freedom when arranging the shot area on the wafer.

In addition, in this embodiment, since the second irradiation point is formed one by one in the vicinity of the four corners within the projection area Ef, and tracking sensors are individually arranged corresponding to each second irradiation point, shot areas (including the chipped shots) of any position may be set (selected) as the first shot for exposure without any problems. Therefore, the degree of freedom can be increased when setting (selecting) the exposure sequence of the shot areas.

The present invention, however, is not limited to this, and only one tracking sensor needs to be arranged, and the slit image (the second irradiation point) corresponding to the tracking sensor may be formed in the vicinity of one corner on the projection area of the reticle pattern on the wafer W. Even in such a case, by selecting a shot area at an appropriate position on the wafer W as the first shot, the positional deviation of the wafer W in the optical axis direction can be swiftly adjusted even if the shot area is the so-called chipped shot.

Figure 13:
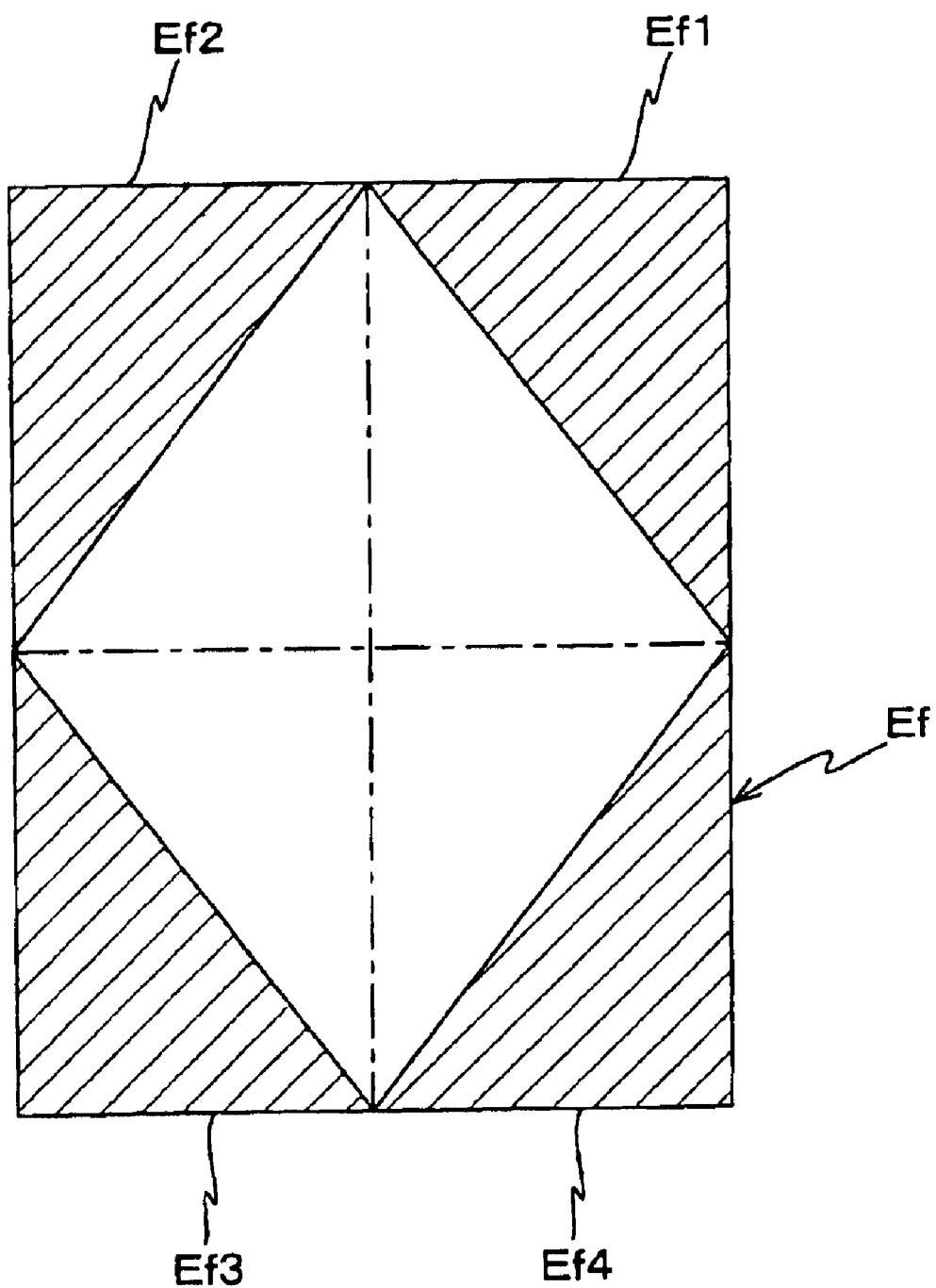
FIG. 13 is a view for explaining a suitable arrangement range of slit images (the second irradiation points) for Z-following.

Or, a plurality of slit images for Z following (the second irradiation point) may be respectively formed in the four corners of the projection area of the reticle pattern on the wafer, and tracking sensors that individually receive the reflection light from these slit images may be arranged corresponding to the number of the second irradiation points. In this case, as is shown in FIG. 13, the projection area Ef can be divided into four rectangular areas Ef1–Ef4 along the XY two-dimensional direction, and each divided area Efi (i=1, 2, 3, 4) can be divided into two along a diagonal line so as to make two triangular shaped areas. And, each second irradiation point can be arranged in the triangular shaped area located on the outer side (the slanted line portion in FIG. 13).

In addition, in the embodiment above, the case has been described where the tracking sensor to be used is selected from the four tracking sensors in accordance with the position of the first shot on the wafer. This, no more, no less, means that the suitable tracking sensor is selected according to the shape of the shot, when the projection area Ef on the wafer where the reticle pattern is projected by the projection optical system PL is a chipped shot with a part of its rectangular shape chipped. Accordingly, in the case a plurality of slit images for Z following (the second irradiation point) is respectively formed in the four corners of the projection area of the reticle pattern on the wafer, and tracking sensors that individually receive the reflection light from these slit images are arranged corresponding to the number of the second irradiation points as is described above, the tracking sensors to be used may be selected depending on the size of the shot area. Or, if a plurality of tracking sensors is arranged, the tracking sensor does not necessarily have to be selectable.

Likewise, in the embodiment above, the case has been described where any photosensor can be selected from a plurality of photosensors $D_{11}$–$D_{55}$. The present invention, however, is not limited to this, and the photosensors may all be used at the same time.

Also, in the embodiment above, when the wafer W surface is arranged in the vicinity of the best image forming plane of the projection optical system PL, the selected tracking sensors may be used for focus leveling control, together with the selected photosensors from the photosensors $D_{11}$–$D_{55}$. This is because when the wafer W surface is arranged in the vicinity of the best image forming plane of the projection optical system PL, the tracking sensors D60–D90 substantially output signals corresponding to the deviation amount of the wafer W surface with respect to the predetermined reference surface in the optical axis direction as the detection signals, and as the tracking sensors D600–D900 sensors similar to the photosensors $D_{11}$–$D_{55}$ are used. In addition, in the embodiment above, the software maybe made to perform the selection of the photosensors or the tracking sensors.

Incidentally, in the embodiment above, the size of the shot area (divided area) in the scanning exposure apparatus used in the mix-and-match was to be 25 mm×33 mm in a rectangular shape. The size, however, is not limited to this, and may be 26 mm×33 in a rectangular shape. In this case, as is with the embodiment above, the 6-inch size reticle can be used, with the projection magnification of the projection optical system PL being ¼.

Or, the size of the shot area (divided area) in the scanning exposure apparatus can be 22 mm×26 mm having a rectangular shape. In this case, the 6-inch size reticle can be used, with the projection magnification of the projection optical system PL being ⅕.

In these cases, similar to the embodiment above, as the projection optical system of the static type exposure apparatus, a projection optical system which image field (wafer side) has a diameter where a shot area of the scanning exposure apparatus is almost inscribed, may be used. That is, when the divided area in the scanning exposure apparatus is a rectangular shape of the size (ammxbmm), as the projection optical system of the static type exposure apparatus, a system having a circular image field with a diameter $D \approx (a^2 + b^2)^{1/2}$ may be used.

In the embodiment above, the case has been described when the light source is made up of a mercury lamp, a KrF excimer laser, an ArF excimer laser, or the like. The present invention, however, is not limited to this, and a harmonic may be used, which is obtained by amplifying a single-wavelength laser beam in the infrared or visible range emitted by a DFB semiconductor laser or a fiber laser with a fiber amplifier doped with, for example, erbium (Er) (or both erbium and ytteribium (Yb)) and converting its wavelength into ultraviolet light using a nonlinear optical crystal.

The present invention, can also be suitably applied to not only the exposure apparatus used for manufacturing a semiconductor device, but also to an exposure apparatus used to transfer a device pattern onto a glass plate when manufacturing a display including a liquid crystal display device, an exposure apparatus used to transfer a device pattern onto a ceramic wafer when manufacturing a thin-film magnetic head, and to an exposure apparatus used when manufacturing a pick-up device (such as a CCD), a DNA chip, a mask or a reticle, and the like.

The exposure apparatus 10 in the embodiment above related to the present invention can be made by incorporating the illumination optical system made up of a plurality of lenses and the projection optical system into the main body of the exposure apparatus and performing optical adjustment, while incorporating the reticle stage RST made up of various mechanical components, the X stage 58, the Y stage 56, and the stage unit 42 consisting of the substrate table 60 and the like into the main body of the exposure apparatus, connecting the wiring and piping, and furthermore, performing total adjustment (electrical adjustment, operational adjustment). The exposure apparatus is preferably made in a clean room in which temperature, degree of cleanliness, and the like are controlled.

Device Manufacturing Method

A device manufacturing method using the exposure apparatus 10 in the embodiment above in a lithographic process will be described next.

Figure 14:
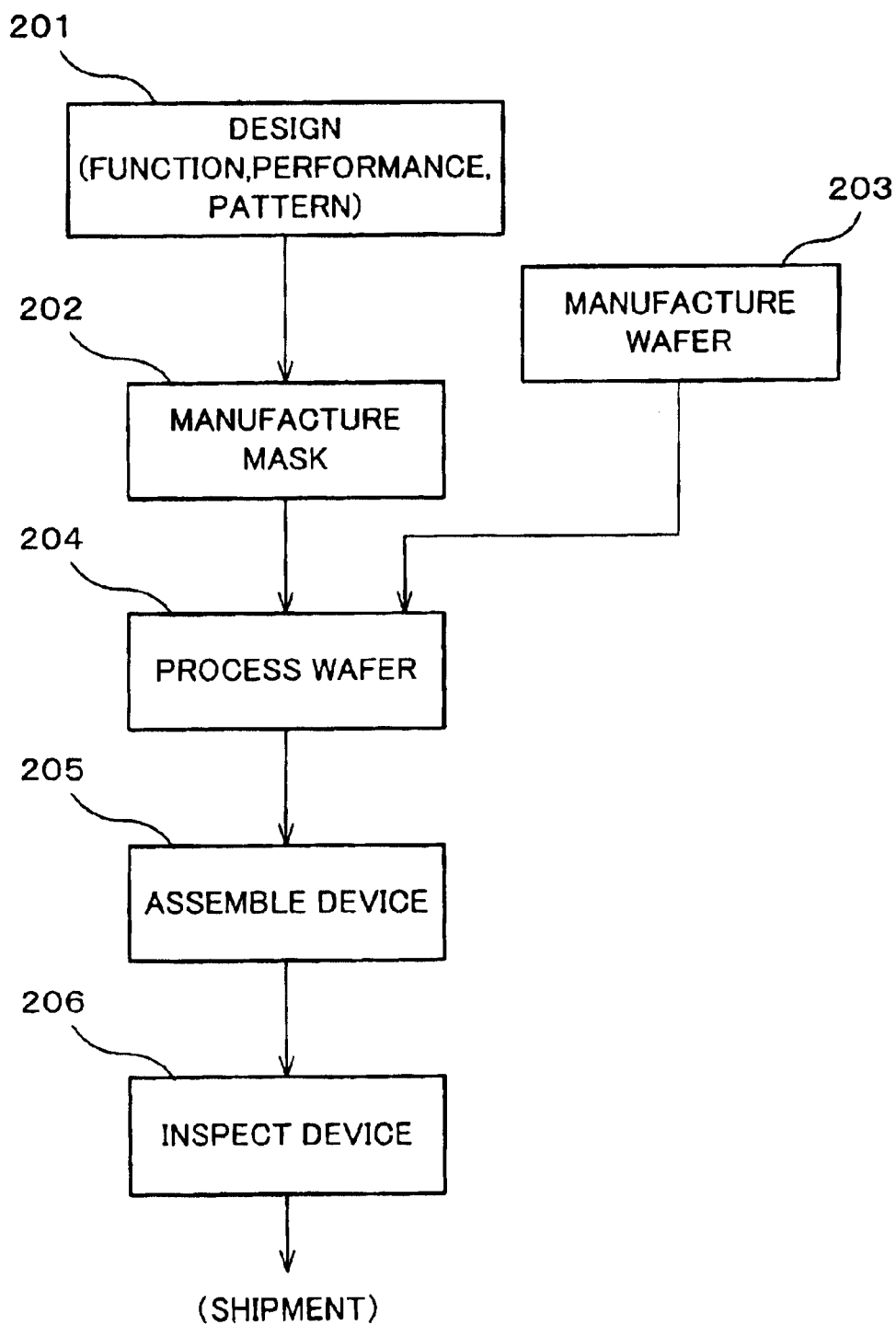
FIG. 14 is a flow chart for explaining an embodiment of a device manufacturing method according to the present invention.

FIG. 14 is a flowchart showing an example of manufacturing a device (a semiconductor chip such as an IC or LSI, a liquid crystal panel, a CCD, a thin magnetic head, a micromachine, or the like). As shown in FIG. 14, in step 201 (design step), function/performance is designed for a device (e.g., circuit design for a semiconductor device) and a pattern to implement the function is designed. Instep 202 (mask manufacturing step), a mask on which the designed circuit pattern is formed is manufactured. Instep 203 (wafer manufacturing step), a wafer is manufacturing by using a silicon material or the like.

Next, in step 204 (wafer processing step), an actual circuit and the like is formed on the wafer by lithography or the like using the mask and wafer prepared in steps 201 to 203, as will be described later. In step 205 (device assembly step), a device is assembled using the wafer processed in step 204. In step 205, processes such as dicing, bonding, and packaging (chip encapsulation) are included, depending on the requirements.

Finally, in step 206 (inspection step), a test on the operation of the device, durability test, and the like are performed. After these steps, the device is completed and shipped out.

Figure 15:
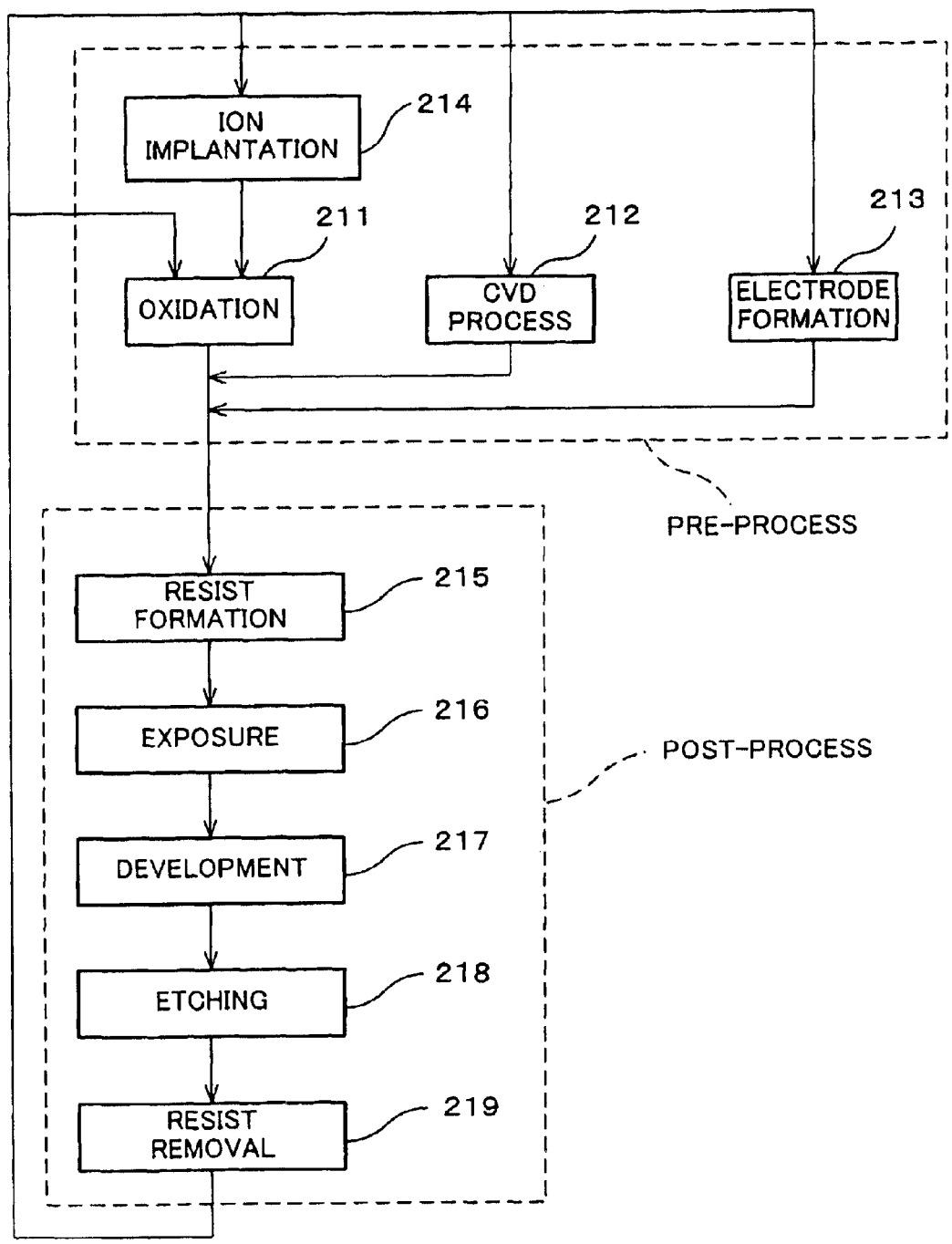
FIG. 15 is a flow chart showing the processing in step 204 in FIG. 14.

FIG. 15 is a flow chart showing a detailed example of step 204 described above in manufacturing the semiconductor device. Referring to FIG. 15, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, in step 216 (exposure step), the circuit pattern on the mask is transferred onto the wafer by the exposure apparatus 10 described above and other exposure apparatus. Then, in step 217 (development step) the exposed wafer is developed. And, in step 218 (etching step), an exposed member on a portion other than the portion where the resist is left is removed by etching. Finally, in step 219 (resist removing step), the unnecessary resist remaining after the etching is completed is removed.

By repeatedly performing these pre-process and post-process steps, multiple circuit patterns are formed on the wafer.

By using the device manufacturing method described so far in this embodiment, the exposure apparatus 10 described in the embodiment above is to be used in the exposure process (step 216). Therefore, exposure is performed with the throughput improved, while maintaining sufficient exposure accuracy. Especially in the case when an exposure process using a scanning exposure apparatus is included in the lithographic process to manufacture a device such as a semiconductor device, by employing the mix-and-match with the exposure apparatus 10 described in the embodiment above, high precision and high throughput can be achieved. Accordingly, the productivity of the microdevice having a fine pattern can be improved by improving the throughput, without reducing its yield.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that performs a static exposure of a substrate via a mask with an energy beam in a state where said mask and said substrate are substantially stationary, said exposure apparatus comprising:

a projection optical system having an image field of which a portion is illuminated with the energy beam during the static exposure and has same size and shape as an area on a substrate exposed in one shot by a scanning exposure in a scanning exposure apparatus, different from said exposure apparatus, that synchronously moves a mask pattern and the substrate for the scanning exposure;

a masking device provided on an optical path through which the energy beam passes to define the illuminated portion in the image field so that said area is exposed with the energy beam through said projection optical system by the static exposure; and a substrate stage on which said substrate is placed.

2. The exposure apparatus according to claim 1, wherein said one area exposed with said scanning exposure apparatus has a rectangular shape with a size which is one of (25 mm×33 mm) and (26 mm×33 mm).

3. The exposure apparatus according to claim 2, wherein said mask is a 6-inch size, and said projection optical system has a projection magnification of ¼.

4. The exposure apparatus according to claim 1, wherein said one area exposed with said scanning exposure apparatus has a rectangular shape with a size of (22 mm×26 mm).

5. The exposure apparatus according to claim 4, wherein said mask is a 6-inch size, and said projection optical system has a projection magnification of ⅕.

6. The exposure apparatus according to claim 1, wherein said image field has a circular shape with a diameter in which said area of the scanning exposure apparatus is almost inscribed.

7. The exposure apparatus according to claim 1, wherein said projection optical system is capable of resolving a pattern having a line width of 0.35 μm on said substrate.

8. The exposure apparatus according to claim 1, said exposure apparatus further comprising:

a control system which totally controls said exposure apparatus and changes a control factor of said exposure apparatus related to throughput in accordance with a minimum line width of a pattern subject to transfer.

9. The exposure apparatus according o claim 8, wherein said control factor subject to said change includes at least one of:

a permissible value of a physical quantity related to a position setting accuracy of said substrate stage;

time until position setting of said substrate stage is judged complete;

a permissible value of error from a target surface of a surface of said substrate with respect to an optical axis direction of said projection optical system;

a permissible value of heat quantity stored in said projection optical system due to irradiation of said energy beam;

a permissible value of vibration quantity of said substrate stage during exposure;

a permissible error of an exposure amount provided on said substrate;

a physical quantity related to an alignment measurement accuracy of said substrate; and an on/off of automatic focusing on alignment measurement.

10. The exposure apparatus according to claim 9, wherein said permissible value of said physical quantity related to a position setting accuracy of said substrate stage includes at least one of a permissible error from a position setting target value, a maximum permissible velocity, and a maximum permissible acceleration.

11. The exposure apparatus according to claim 9, wherein said physical quantity related to an alignment measurement accuracy of said substrate includes at least one of a quantity related to selection on selecting an alignment mark for alignment measurement from a plurality of alignment marks on said substrate and a measurement time of said alignment mark.

12. The exposure apparatus according to claim 8, wherein said control system changes said control factor in 2 stages, in the case when said minimum line width is less than 0.7 $\mu$m and in the case when said minimum line width is equal to and over 0.7 $\mu$m.

13. A device manufacturing method including a lithographic process, comprising:

transferring a pattern onto an object using said exposure apparatus according to claim 1.

14. The apparatus according to claim 1, further comprising:

a control system which changes a control factor related to throughput of said exposure apparatus, wherein the control system has a plurality of exposure modes including a first mode, and a second mode which raises said throughput by making said control factor different from the first mode.

15. The apparatus according to claim 14, wherein said control factor includes a factor related to at least one of control accuracy of said substrate stage, image forming performance of said projection optical system, alignment accuracy between a pattern image of said mask and said substrate, and exposure amount control accuracy of said substrate.

16. The apparatus according to claim 14, wherein one of said plurality of exposure modes is selected in accordance with a pattern to be transferred onto an area on said substrate.

17. The apparatus according to claim 1, wherein said projection optical system has a circular image field having a diameter larger than a diameter of a circular image field of a projection optical system of said scanning exposure apparatus.

18. The apparatus according to claim 17, wherein said projection optical system has resolution lower than resolution of a projection optical system of said scanning exposure apparatus.

19. The apparatus according to claim 1, wherein said projection optical system projects a reduced image of a pattern onto said substrate, said pattern having a minimum line width wider than a minimum line width of a pattern which is transferred onto said substrate by said scanning exposure apparatus.

20. The apparatus according to claim 1, wherein when an area exposed in one time by said scanning exposure apparatus has a size of a mm×b mm, said projection optical system has a circular image field with a diameter of $D \approx (a^2+b^2)^{1/2}$.

21. The apparatus according to claim 20, wherein said projection optical system reduces and projects a pattern entirely onto said substrate in one shot, said pattern being formed on a mask of 6-inch size and to be transferred onto said area.

22. The apparatus according to claim 21, wherein said projection optical system has a projection magnification which is one of ¼ and ⅕.

23. The apparatus according to claim 20, wherein said projection optical system reduces and projects a pattern entirely onto said substrate in one shot, said pattern being formed on a mask having a same size as a mask used in said scanning exposure apparatus and to be transferred onto said area.

24. The apparatus according to claim 23, wherein said projection optical system has a projection magnification which is one of ¼ and ⅕.

25. A device manufacturing method including a lithographic process, comprising:

transferring a pattern onto an object using said exposure apparatus according to claim 1; and transferring a pattern onto the object using said scanning exposure apparatus.

26. The method according to claim 25, wherein said exposure apparatus transfers a pattern onto a different layer from a layer on said object on which a pattern is transferred by said scanning exposure apparatus.

27. The method according to claim 26, wherein a layer on which a pattern is transferred by said scanning exposure apparatus is a critical layer.

28. The method according to claim 26, wherein said different layer onto which a pattern is transferred by said exposure apparatus is one of a middle layer and a rough layer.

29. The method according to 25, wherein said exposure apparatus is based on a step-and-repeat method and said scanning exposure apparatus is based on a step-and-scan method.

* * * * *